(12) United States Patent
Yoneda et al.

(10) Patent No.: US 8,704,221 B2
(45) Date of Patent: Apr. 22, 2014

(54) SEMICONDUCTOR DEVICE

(71) Applicant: Semiconductor Energy Laboratory Co., Ltd., Atsugi (JP)

(72) Inventors: Seiichi Yoneda, Atsugi (JP); Takuro Ohmaru, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/716,924

(22) Filed: Dec. 17, 2012

(65) Prior Publication Data

US 2013/0161607 A1    Jun. 27, 2013

(30) Foreign Application Priority Data

Dec. 23, 2011  (JP) .................. 2011-282483

(51) Int. Cl.
  *H01L 29/12* (2006.01)
(52) U.S. Cl.
  USPC ..................... 257/43; 257/E29.296
(58) Field of Classification Search
  USPC .............. 257/43, E21.364, E29.296
  See application file for complete search history.

(56) References Cited

U.S. PATENT DOCUMENTS

| | | | |
|---|---|---|---|
| 4,555,721 A | 11/1985 | Bansal et al. | |
| 5,095,347 A | 3/1992 | Kirsch | |
| 5,100,817 A | 3/1992 | Cederbaum et al. | |
| 5,341,327 A | 8/1994 | Kuriyama | |
| 5,567,959 A | 10/1996 | Mineji | |
| 5,731,856 A | 3/1998 | Kim et al. | |
| 5,744,864 A | 4/1998 | Cillessen et al. | |
| 5,949,092 A | 9/1999 | Kadosh et al. | |
| 6,294,274 B1 | 9/2001 | Kawazoe et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters) , Sep. 27, 2004, vol. 85, No. 13, pp. 2541-2543.

(Continued)

*Primary Examiner* — David S Blum
(74) *Attorney, Agent, or Firm* — Eric J. Robinson; Robinson Intellectual Property Law Office, P.C.

(57) ABSTRACT

A semiconductor device with high productivity and high yield is provided. The semiconductor device includes a word line, a capacitor line, a first bit line, a second bit line, and a first transistor and a second transistor each of which includes a gate, a source, and a drain. The first transistor and the second transistor at least partly overlap with each other, and the gates of the first transistor and the second transistor are connected to the word line. A capacitor is formed between at least part of the capacitor line and each of the drains of the first transistor and the second transistor. The first bit line is connected to the source of the first transistor, and the second bit line is connected to the source of the second transistor.

19 Claims, 12 Drawing Sheets

(56) References Cited

U.S. PATENT DOCUMENTS

| | | |
|---|---|---|
| 6,563,174 B2 | 5/2003 | Kawasaki et al. |
| 6,649,980 B2 | 11/2003 | Noguchi |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,049,253 B2 | 11/2011 | Isobe |
| 8,237,166 B2 | 8/2012 | Kumomi et al. |
| 8,278,162 B2 | 10/2012 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0156027 A1 | 6/2011 | Yamazaki et al. |
| 2012/0018808 A1 | 1/2012 | Isobe |
| 2012/0273774 A1 | 11/2012 | Noda |
| 2013/0140569 A1 | 6/2013 | Yoneda et al. |
| 2013/0153890 A1* | 6/2013 | Yoneda .......................... 257/43 |
| 2013/0161713 A1 | 6/2013 | Yamazaki et al. |

FOREIGN PATENT DOCUMENTS

| | | |
|---|---|---|
| JP | 60-198861 A | 10/1985 |
| JP | 63-102264 A | 5/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-246863 A | 10/1989 |
| JP | 05-251705 A | 9/1993 |
| JP | 06-013606 A | 1/1994 |
| JP | 06-291269 A | 10/1994 |
| JP | 07-094743 A | 4/1995 |
| JP | 07-193251 A | 7/1995 |
| JP | 08-148693 A | 6/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-184993 A | 6/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2010-283338 A | 12/2010 |
| JP | 2011-151383 A | 8/2011 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '9 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Display,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu,or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE

BACKGROUND OF THE INVENTION

1. Field of the Invention

The present invention relates to a semiconductor device and a method for manufacturing the same.

Note that in this specification, a semiconductor device refers to any device that can function by utilizing semiconductor characteristics, and a semiconductor memory device, an electro-optical device, a semiconductor circuit, an electronic device, and the like are all included in the category of semiconductor devices.

2. Description of the Related Art

Attention has been focused on a technique for forming a transistor using a semiconductor film which is formed on a substrate having an insulating surface. The transistor has been widely used for semiconductor devices such as integrated circuits (ICs) and image display devices (display devices). A silicon-based semiconductor film is known as a semiconductor film applicable to a transistor. As another semiconductor film, an oxide semiconductor film has been attracting attention recently.

For example, a transistor using the following amorphous oxide semiconductor film is disclosed: the amorphous oxide semiconductor film contains indium, gallium, and zinc and has an electron carrier concentration of lower than $10^{18}/cm^3$ (see Patent Document 1).

Since the oxide semiconductor film has a high electron mobility, the operation speed of a transistor using the oxide semiconductor film is significantly higher than that of a transistor using an amorphous silicon film. There is also an advantage that capital investment can be reduced because part of production equipment for a transistor using an amorphous silicon film can be retrofitted and utilized.

Further, a memory element utilizing the characteristics of a transistor including an oxide semiconductor film is disclosed (see Patent Document 2). The oxide semiconductor film can be deposited by a technique for forming a thin film, such as a sputtering method. A transistor using the oxide semiconductor film can be manufactured in a low-temperature process at 350° C. or lower. Therefore, the transistor using the oxide semiconductor film can be manufactured over another transistor with few limitations, resulting in a reduction in the cell area.

REFERENCES

Patent Documents

[Patent Document 1] Japanese Published Patent Application No. 2006-165528
[Patent Document 2] Japanese Published Patent Application No. 2011-151383

SUMMARY OF THE INVENTION

In the case where a transistor using an oxide semiconductor film overlaps with another transistor, however, the number of steps and layers increases, which might cause a decrease in yield due to complicated manufacturing process.

An object of one embodiment of the present invention is to provide a semiconductor device with high productivity and high yield while suppressing an increase in the number of steps and layers even when transistors overlap with each other.

Another object of one embodiment of the present invention is to provide a semiconductor device with a small area, to provide a semiconductor device with low power consumption, and to provide a semiconductor device with a small area and low power consumption.

A semiconductor device of one embodiment of the present invention includes a word line, a capacitor line, a first bit line, a second bit line, and a first transistor and a second transistor each of which includes a gate, a source, and a drain. The first transistor and the second transistor at least partly overlap with each other, and the gates of the first transistor and the second transistor are connected to the word line. A capacitor is formed between at least part of the capacitor line and each of the drains of the first transistor and the second transistor. The first bit line is connected to the source of the first transistor, and the second bit line is connected to the source of the second transistor. Such a structure is referred to as a structure A.

In the structure A, the one word line is connected to the gates of the two transistors, and the two capacitors are formed with at least part of the one capacitor line. Consequently, the number of word lines and capacitor lines can be reduced, resulting in a reduction in the number of steps and layers. When the word line and the capacitor line are formed with the same layer, the number of steps and layers can be further reduced.

A semiconductor device of one embodiment of the present invention at least partly overlaps with the structure A, and includes a second word line, a second capacitor line, a third bit line, and a third transistor and a fourth transistor each of which includes a gate, a source, and a drain. The third transistor and the fourth transistor at least partly overlap with each other, and the gates of the third transistor and the fourth transistor are connected to the second word line. A capacitor is formed between at least part of the second capacitor line and each of the drains of the third transistor and the fourth transistor. The second bit line is connected to the source of the third transistor, and the third bit line is connected to the source of the fourth transistor. Note that the second bit line is the same as the second bit line in the structure A. Such a structure excluding the structure A is referred to as a structure B.

In the structure B, like in the structure A, the one second word line is connected to the gates of the two transistors, and the two capacitors are formed with at least part of the one second capacitor line. Consequently, the number of word lines and capacitor lines can be reduced, resulting in a reduction in the number of steps and layers. When the second word line and the second capacitor line are formed with the same layer, the number of steps and layers can be further reduced.

The second bit line is shared between the structure A and the structure B; thus, the number of steps and layers can be further reduced.

A semiconductor device of one embodiment of the present invention at least partly overlaps with the structure A or the structure B, and includes a third word line, a third capacitor line, a fourth bit line, and a fifth transistor and a sixth transistor each of which includes a gate, a source, and a drain. The fifth transistor and the sixth transistor at least partly overlap with each other, and the gates of the fifth transistor and the sixth transistor are connected to the third word line. A capacitor is formed between at least part of the third capacitor line and each of the drains of the fifth transistor and the sixth transistor. The third bit line is connected to the source of the fifth transistor, and the fourth bit line is connected to the source of the sixth transistor. Note that the third bit line is the same as the third bit line in the structure B. Such a structure excluding the structure A and the structure B is referred to as a structure C. In this manner, semiconductor devices can be made to overlap in sequence.

When a plurality of semiconductor devices overlap with each other as described above, an increase in the number of steps and layers can be suppressed. In addition, the memory capacity of the semiconductor device can be increased without increasing the cell area.

A semiconductor device of one embodiment of the present invention includes first to 2n-th word lines (n is a natural number), first to 2n-th capacitor lines, first to (n+1)th bit lines, first to 4n-th transistors each of which includes a gate, a source, and a drain, and first to 4n-th capacitors. A (4m−3)th transistor (m is a natural number of n or less) and a (4m−1)th transistor at least partly overlap with each other, and gates of the (4m−3)th transistor and the (4m−1)th transistor are connected to a (2m−1)th word line. A (4m−2)th transistor and a 4m-th transistor at least partly overlap with each other, and gates of the (4m−2)th transistor and the 4m-th transistor are connected to a 2m-th word line. A (4m−3)th capacitor is formed between at least part of a (2m−1)th capacitor line and a drain of the (4m−3)th transistor, and a (4m−1)th capacitor is formed between at least part of the (2m−1)th capacitor line and a drain of the (4m−1)th transistor. A (4m−2)th capacitor is formed between at least part of a 2m-th capacitor line and the drain of the (4m−2)th transistor, and a 4m-th capacitor is formed between at least part of the 2m-th capacitor line and a drain of the 4m-th transistor. An m-th bit line is connected to sources of the (4m−3)th transistor and the (4m−2)th transistor, and a (m+1)th bit line is connected to sources of the (4m−1)th transistor and the 4m-th transistor.

The transistor included in the semiconductor device of one embodiment of the present invention is preferably a transistor using an oxide semiconductor film. The oxide semiconductor film can be deposited by a technique for forming a thin film, such as a sputtering method. The sputtering method allows deposition at a relatively low temperature, and thus is preferably used for manufacturing a structure including transistors which overlap with each other.

Note that the transistor included in the semiconductor device of one embodiment of the present invention is not limited to a transistor using an oxide semiconductor film. For example, other than the transistor using an oxide semiconductor film, a transistor using an amorphous silicon film, a transistor using polycrystalline silicon, a transistor formed on a silicon wafer, and the like can be used in combination as appropriate.

When the word line, the capacitor line, and the bit line are shared, an increase in the number of steps and layers can be suppressed and a semiconductor device with high productivity and high yield can be provided.

In addition, a semiconductor device with a small area and low power consumption can be provided.

DETAILED DESCRIPTION OF THE INVENTION

Figure 1A:
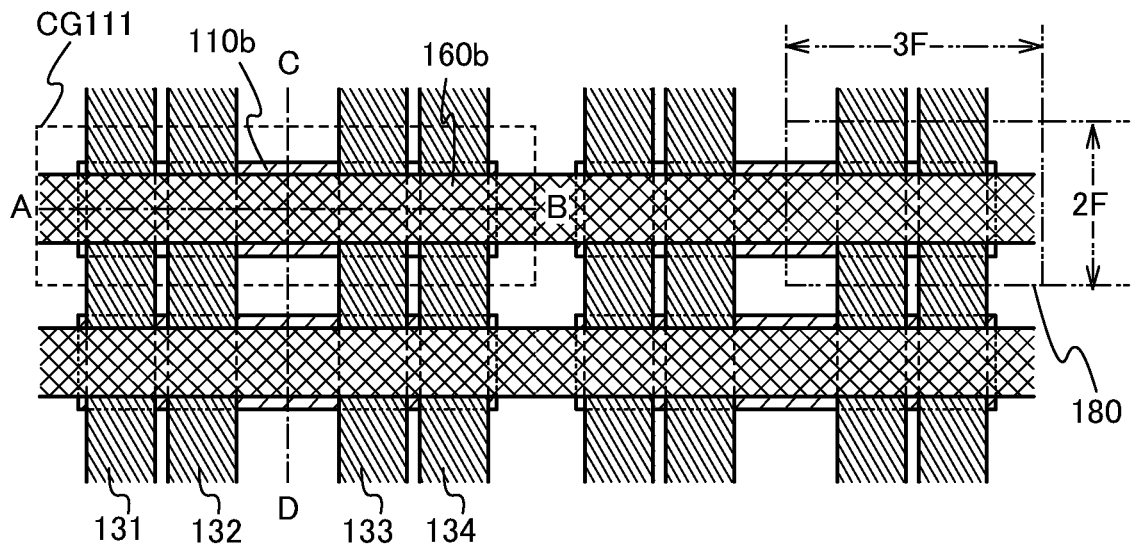
FIGS. 1A and 1B are respectively a top view and a cross-sectional view illustrating an example of a semiconductor device of one embodiment of the present invention.

Hereinafter, embodiments of the present invention will be described in detail with reference to the accompanying drawings. Note that the present invention is not limited to the description below, and it is easily understood by those skilled in the art that modes and details disclosed herein can be modified in various ways. Therefore, the present invention is not construed as being limited to description of the embodiments. In the description of the structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is referred to as a drain, the other is referred to as a source in this specification. That is, they are not distinguished depending on the potential level. Therefore, a portion referred to as a source in this specification can be alternatively referred to as a drain. A portion simply referred to as "source" refers to any of a source electrode and a source region. Further, a portion simply referred to as "drain" refers to any of a drain electrode and a drain region.

A voltage usually refers to a potential difference between a given potential and a reference potential (e.g., a source potential or a ground potential (GND)). A voltage can be referred to as a potential and vice versa.

Even when the expression "connect" is used in this specification, in an actual circuit, there is a case in which no physical connection is made and a wiring is just extended. An element which does not adversely affect circuit operation, such as a resistor, may be included between the connected components.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, an example of a semiconductor device of one embodiment of the present invention will be described with reference to FIGS. 1A and 1B, FIG. 2, FIGS. 3A to 3E, FIGS. 4A to 4D, FIGS. 5A to 5C, FIGS. 6A to 6C, and FIGS. 7A and 7B.

Figure 1B:
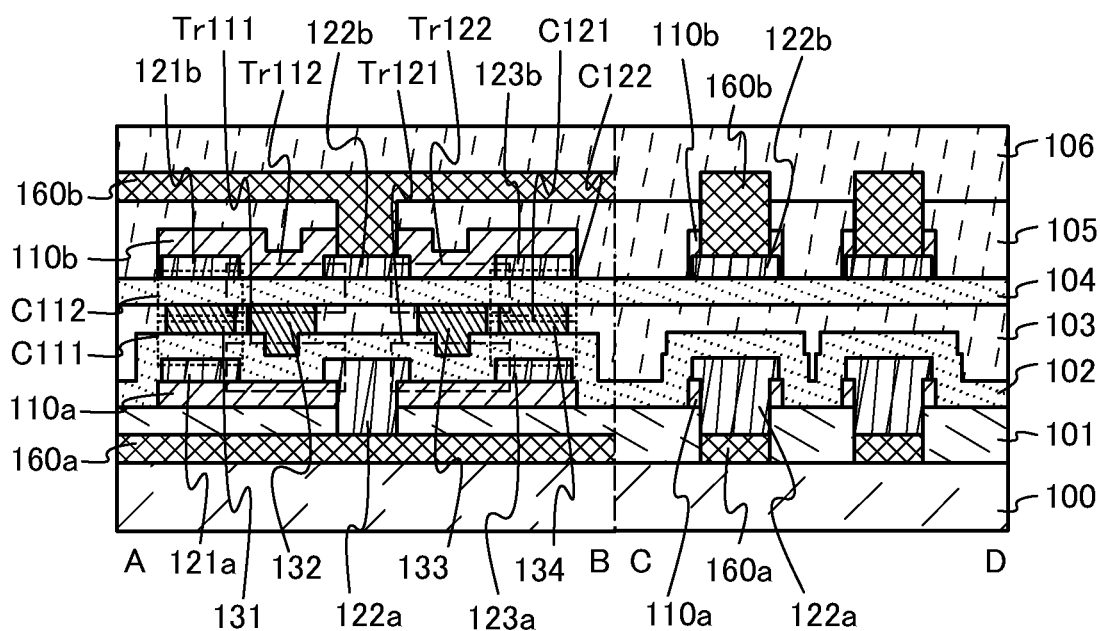

FIG. 1A is a top view of the semiconductor device of one embodiment of the present invention. FIG. 1B illustrates a cross-section A-B and a cross-section C-D corresponding to a dashed-dotted line A-B and a dashed-dotted line C-D of FIG. 1A, respectively. In FIG. 1A, films, insulating films, and the like which overlap with each other are omitted for simplicity.

The semiconductor device illustrated in FIG. 1B includes the following: a conductive film 160a provided over a substrate 100; an insulating film 101 which has an opening reaching the conductive film 160a and is provided over the substrate 100 and the conductive film 160a; a semiconductor film 110a which has an opening reaching the conductive film 160a and is provided over the insulating film 101; a conductive film 121a and a conductive film 123a which are provided over the semiconductor film 110a; a conductive film 122a which is formed with the same layer as the conductive film 121a and the conductive film 123a and provided in contact with the conductive film 160a through the opening formed in the semiconductor film 110a and the insulating film 101; an insulating film 102 provided over the insulating film 101, the semiconductor film 110a, the conductive film 121a, the conductive film 123a, and the conductive film 122a; a conductive film 131 which is provided over the insulating film 102 so as to at least partly overlap with the conductive film 121a; a conductive film 134 which is provided over the insulating film 102 so as to at least partly overlap with the conductive film 123a; a conductive film 132 which is formed with the same layer as the conductive film 131 and the conductive film 134 and provided between the conductive film 121a and the conductive film 122a; a conductive film 133 which is formed with the same layer as the conductive film 131 and the conductive film 134 and provided between the conductive film 123a and the conductive film 122a; an insulating film 103 provided over the insulating film 102; an insulating film 104 provided over the conductive film 131, the conductive film 132, the conductive film 133, the conductive film 134, and the insulating film 103; a conductive film 121b which is provided over the insulating film 104 so as to at least partly overlap with the conductive film 131; a conductive film 123b which is provided over the insulating film 104 so as to at least partly overlap with the conductive film 134; a conductive film 122b which is formed with the same layer as the conductive film 121b and the conductive film 123b and at least partly overlaps with the conductive film 122a; a semiconductor film 110b which has an opening reaching the conductive film 122b and is provided over the insulating film 104, the conductive film 121b, the conductive film 122b, and the conductive film 123b; an insulating film 105 which has an opening reaching the conductive film 122b and is provided over the insulating film 104 and the semiconductor film 110b; a conductive film 160b which is provided over the insulating film 105 and in contact with the conductive film 122b through the opening formed in the insulating film 105 and the semiconductor film 110b; and an insulating film 106 provided over the insulating film 105 and the conductive film 160b.

The insulating film 106 is not necessarily provided in the semiconductor device illustrated in FIG. 1B.

Top surfaces of the conductive film 131, the conductive film 132, the conductive film 133, the conductive film 134, and the insulating film 103 are level with each other.

FIG. 1B illustrates a cell group CG111 including first to fourth memory cells. Note that a region 180 illustrated in FIG. 1A is 2F by 3F (F: feature size), namely, an area of $6F^2$. Note also that a first memory cell and a second memory cell overlap with each other in a region having the same area as the region 180 (a third memory cell and a fourth memory cell also overlap with each other); thus, $6F^2$ is the area of two memory cells. In other words, having a size of $3F^2$, a small-size memory cell can be realized.

The first memory cell includes a transistor Tr111 and a capacitor C111.

The transistor Tr111 includes at least part of the semiconductor film 110a, at least part of the conductive film 121a, at least part of the conductive film 122a, at least part of the insulating film 102, and at least part of the conductive film 132. In the transistor Tr111, at least part of the semiconductor film 110a serves as a channel region, at least part of the conductive film 121a serves as a drain electrode, at least part of the conductive film 122a serves as a source electrode, at least part of the insulating film 102 serves as a gate insulating film, and at least part of the conductive film 132 serves as a gate electrode.

The capacitor C111 includes at least part of the conductive film 121a, at least part of the insulating film 102, and at least part of the conductive film 131. In the capacitor C111, at least part of the conductive film 121a and at least part of the conductive film 131 serve as capacitor electrodes, and at least part of the insulating film 102 serves as a dielectric layer.

The second memory cell includes a transistor Tr112 and a capacitor C112.

The transistor Tr112 includes at least part of the semiconductor film 110b, at least part of the conductive film 121b, at least part of the conductive film 122b, at least part of the insulating film 104, and at least part of the conductive film 132. In the transistor Tr112, at least part of the semiconductor film 110b serves as a channel region, at least part of the conductive film 121b serves as a drain electrode, at least part of the conductive film 122b serves as a source electrode, at least part of the insulating film 104 serves as a gate insulating film, and at least part of the conductive film 132 serves as a gate electrode.

The conductive film 132 serving as a gate electrode is shared between the transistor Tr111 and the transistor Tr112.

The capacitor C112 includes at least part of the conductive film 121b, at least part of the insulating film 104, and at least part of the conductive film 131. In the capacitor C112, at least part of the conductive film 121b and at least part of the conductive film 131 serve as capacitor electrodes, and at least part of the insulating film 104 serves as a dielectric layer.

The conductive film 131 serving as a capacitor electrode is shared between the capacitor C111 and the capacitor C112.

The third memory cell includes a transistor Tr121 and a capacitor C121.

The transistor Tr121 includes at least part of the semiconductor film 110a, at least part of the conductive film 123a, at least part of the conductive film 122a, at least part of the insulating film 102, and at least part of the conductive film 133. In the transistor Tr121, at least part of the semiconductor film 110a serves as a channel region, at least part of the conductive film 123a serves as a drain electrode, at least part of the conductive film 122a serves as a source electrode, at least part of the insulating film 102 serves as a gate insulating film, and at least part of the conductive film 133 serves as a gate electrode.

The conductive film 122a serving as a source electrode is shared between the transistor Tr111 and the transistor Tr121.

The capacitor C121 includes at least part of the conductive film 123a, at least part of the insulating film 102, and at least part of the conductive film 134. In the capacitor C121, at least part of the conductive film 123a and at least part of the conductive film 134 serve as capacitor electrodes, and at least part of the insulating film 102 serves as a dielectric layer.

The fourth memory cell includes a transistor Tr122 and a capacitor C122.

The transistor Tr122 includes at least part of the semiconductor film 110b, at least part of the conductive film 123b, at least part of the conductive film 122b, at least part of the insulating film 104, and at least part of the conductive film 133. In the transistor Tr122, at least part of the semiconductor film 110b serves as a channel region, at least part of the conductive film 123b serves as a drain electrode, at least part of the conductive film 122b serves as a source electrode, at least part of the insulating film 104 serves as a gate insulating film, and at least part of the conductive film 133 serves as a gate electrode.

The conductive film 133 serving as a gate electrode is shared between the transistor Tr121 and the transistor Tr122. The conductive film 122b serving as a source electrode is shared between the transistor Tr112 and the transistor Tr122.

The capacitor C122 includes at least part of the conductive film 123b, at least part of the insulating film 104, and at least part of the conductive film 134. In the capacitor C122, at least part of the conductive film 123b and at least part of the conductive film 134 serve as capacitor electrodes, and at least part of the insulating film 104 serves as a dielectric layer.

A capacitor electrode is shared between the capacitor C121 and the capacitor C122.

The conductive film 160a serves as a first bit line.
The conductive film 160b serves as a second bit line.
The conductive film 132 serves as a first word line.
The conductive film 133 serves as a second word line.
The conductive film 131 serves as a first capacitor line.
The conductive film 134 serves as a second capacitor line.

Figure 2:
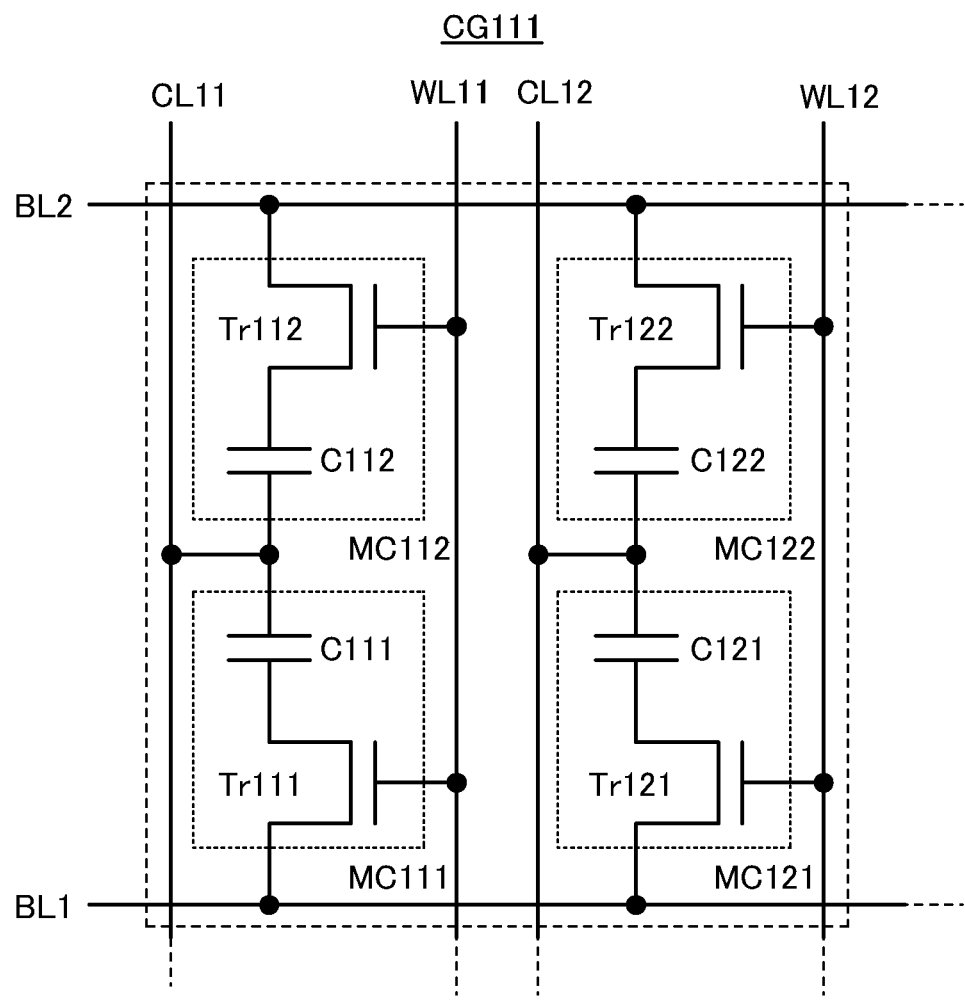
FIG. 2 is a circuit diagram illustrating an example of a semiconductor device of one embodiment of the present invention.

FIG. 2 is a circuit diagram corresponding to the cell group CG111 illustrated in FIG. 1A.

In FIG. 2, the cell group CG111 includes a memory cell MC111 (equivalent to the first memory cell), a memory cell MC112 (equivalent to the second memory cell), a memory cell MC121 (equivalent to the third memory cell), a memory cell MC122 (equivalent to the fourth memory cell), a bit line BL1 (equivalent to the first bit line), a bit line BL2 (equivalent to the second bit line), a word line WL11 (equivalent to the first word line), a word line WL12 (equivalent to the second word line), a capacitor line CL11 (equivalent to the first capacitor line), and a capacitor line CL12 (equivalent to the second capacitor line).

A connection relationship in the cell group CG111 illustrated in FIG. 2 will be described below. The bit line BL1 is connected to a source of the transistor Tr111 and a source of the transistor Tr121. The bit line BL2 is connected to a source of the transistor Tr112 and a source of the transistor Tr122. The word line WL11 is connected to a gate of the transistor Tr111 and a gate of the transistor Tr112. The word line WL12 is connected to a gate of the transistor Tr121 and a gate of the transistor Tr122. The capacitor line CL11 is connected to one electrode of the capacitor C111 and one electrode of the capacitor C112. The capacitor line CL12 is connected to one electrode of the capacitor C121 and one electrode of the capacitor C122. A drain of the transistor Tr111 is connected to the other electrode of the capacitor C111. A drain of the transistor Tr112 is connected to the other electrode of the capacitor C112. A drain of the transistor Tr121 is connected to the other electrode of the capacitor C121. A drain of the transistor Tr122 is connected to the other electrode of the capacitor C122.

Data is written to and read from the cell group CG111 in the following manner.

By way of example, a method for writing data to the memory cell MC121 will be described. First, the potential of the capacitor line CL12 is set to GND. Then, the potential of the word line WL12 is set to VH (a potential higher than the sum of the threshold voltage (Vth) of the transistor Tr121 and VDD (power supply potential)), and the potentials of the other word lines are set to GND (or lower than GND). Next, the potential of the bit line BL1 is set to VDD and the potentials of the other bit lines are set to a floating potential. Thus, the capacitor C121 in the memory cell MC121 is charged to VDD. Then, the potential of the word line WL12 is set to GND (or lower than GND), whereby data 1 is stored in the memory cell MC121. Note that the storage of data 1 means that a capacitor is charged to VDD. Data can be written to the other memory cells in the same way.

The potential of the capacitor line CL12 may always be set to GND. The same applies to the other capacitor lines.

Alternatively, data can be written to memory cells connected to the same word line at a time. For example, data is written to the memory cells (the memory cell MC111, the memory cell MC112, and the like) connected to the word line WL11 in the following manner. First, the potential of the capacitor line CL11 is set to GND. After the potential VH is applied to the word line WL11, the potential of the bit line connected to the memory cell to which data 1 is to be written is set to VDD while the potential of the bit line connected to the memory cell to which data 0 is to be written is set to GND. Then, the potential of the word line WL11 is set to GND (or lower than GND), whereby data is stored in the capacitors. Data can be written to the other memory cells in the same way.

Next, as an example, a method for reading data from the memory cell MC121 will be described. First, the bit line BL1 is set to a predetermined potential (fixed potential). Next, the potential of the word line WL12 is set to VH, whereby the potential corresponding to the data which has been written to the capacitor C121 is applied to the bit line BL1. After that, the applied potential is read by a sense amplifier (not illustrated). Note that the data which has been written to the memory cell MC121 is erased when being read. However, the data is amplified by the operation of the sense amplifier, and rewritten to the memory cell MC121. Data can be read from the other memory cells in the same way.

Alternatively, data can be read from memory cells connected to the same word line at a time. For example, in the case where data is read from the memory cells connected to the word line WL11, all the bit lines are set to a predetermined potential (fixed potential). Then, the potential of the word line WL11 is set to VH, whereby the potential of each bit line varies depending on the data. Data can be read from the other memory cells in the same way.

That is the way how data is written to and read from the cell group CG111.

Each layer will be described referring to FIG. 1B again.

For the semiconductor film 110a, a semiconductor film such as an oxide semiconductor film, an amorphous silicon film, a polycrystalline silicon film, or a single-crystal silicon film may be used. It is preferable to use an oxide semiconductor film for the semiconductor film 110a.

The oxide semiconductor film may be formed using an In-M-Zn—O compound, for example. Here, a metal element M is an element whose bond energy with oxygen is higher than that of In and that of Zn. Alternatively, the metal element M is an element which has a function of suppressing desorption of oxygen from the In-M-Zn—O compound. Owing to the effect of the metal element M, generation of oxygen vacancies in the oxide semiconductor film is suppressed to some extent. It is thus possible to reduce variation in the electrical characteristics of the transistor which is caused by oxygen vacancies, so that a highly reliable transistor can be obtained.

Specifically, the metal element M may be Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. For the metal element M, one or more elements may be selected from the above elements. Si or Ge may be used instead of the metal element M.

The concentration of hydrogen in the oxide semiconductor film is preferably lower than or equal to $2\times10^{20}$ atoms/cm$^3$, more preferably lower than or equal to $5\times10^{19}$ atoms/cm$^3$, and still more preferably lower than or equal to $1\times10^{19}$ atoms/cm$^3$. This is because hydrogen in the oxide semiconductor film generates unintentional carriers in some cases, and the carriers might vary the electrical characteristics of the transistor.

An oxide semiconductor film is in a single crystal state, a polycrystalline (also referred to as polycrystal) state, an amorphous state, or the like.

The oxide semiconductor film is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal portions and amorphous portions are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, a grain boundary in the CAAC-OS film is not found with the TEM. Thus, a reduction in carrier mobility due to the grain boundary is suppressed in the CAAC-OS film.

In each of the crystal portions included in the CAAC-OS film, a c-axis is aligned in a direction perpendicular to a surface where the CAAC-OS film is formed or a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions on the surface of the oxide semiconductor film is sometimes higher than that on the surface where the oxide semiconductor film is formed. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing treatment for crystallization such as heat treatment after film formation.

With the use of the CAAC-OS film in a transistor, variation in the electrical characteristics of the transistor due to irradiation with visible light or ultraviolet light is small. Thus, the transistor has high reliability.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used. Any of these substrates further provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is difficult in some cases due to the shrinkage of the substrate 100, which is caused by heat treatment or the like in a manufacturing process of the semiconductor device. Accordingly, in the case where the above-described large glass substrate is used as the substrate 100, a substrate with small shrinkage is preferably used. For example, a large glass substrate whose shrinkage by heat treatment for one hour at 400° C., preferably 450° C., and more preferably 500° C. is less than or equal to 10 ppm, preferably less than or equal to 5 ppm, and more preferably less than or equal to 3 ppm, may be used as the substrate 100.

Further, a flexible substrate may be used as the substrate 100. A transistor may be formed over a flexible substrate in the following manner: after a transistor is formed over a non-flexible substrate, the transistor is separated and transferred to the substrate 100 which is a flexible substrate. In that case, a separation layer is preferably provided between the non-flexible substrate and the transistor.

The conductive film 160a may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The insulating film 101 may be formed of a single layer or a stacked layer of an insulating film(s) containing any of aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

Silicon oxynitride refers to a substance that contains more oxygen than nitrogen, and silicon nitride oxide refers to a substance that contains more nitrogen than oxygen.

In the case where the semiconductor film 110a is an oxide semiconductor film, the insulating film 101 preferably contains excess oxygen. The excess oxygen in the insulating film is released by heat treatment or the like. The released oxygen allows a reduction of oxygen vacancies in the semiconductor film 110a and in the vicinity of the semiconductor film 110a. The oxygen vacancies in the oxide semiconductor film partly become a donor and cause carriers, which might vary the electrical characteristics of the transistor. Note that in this specification, the vicinity of the semiconductor film refers to the interface between the semiconductor film and a film in contact with the semiconductor film.

In the case where the semiconductor film 110a is an oxide semiconductor film, the concentration of hydrogen in the insulating film 101 is preferably lower than or equal to $1\times10^{21}$ atoms/cm$^3$, more preferably lower than or equal to $5\times10^{20}$ atoms/cm$^3$, and still more preferably lower than or equal to $1\times10^{20}$ atoms/cm$^3$. This is because in the case where the semiconductor film 110a is an oxide semiconductor film, hydrogen in the insulating film 101 moves to the semiconductor film 110a and the vicinity of the semiconductor film 110a, and generates unintentional carriers in some cases. The carriers might vary the electrical characteristics of the transistor.

It is preferable that the insulating film 101 be sufficiently flat. Specifically, the insulating film 101 is provided so as to have an average surface roughness (Ra) less than or equal to 1 nm, preferably less than or equal to 0.3 nm, and more preferably less than or equal to 0.1 nm When the average surface roughness Ra is less than or equal to the above value, a crystal region is easily formed in the semiconductor film 110a in the case where the semiconductor film 110a is an oxide semiconductor film. Further, when the degree of roughness at the interface between the insulating film 101 and the semiconductor film 110a is small, the influence of interface scattering can be reduced. Note that the average surface roughness Ra is obtained by expanding arithmetic mean surface roughness that is defined by JIS B 0601: 2001 (ISO4287: 1997), into three dimensions for application to a curved surface, and Ra can be expressed as the average value of the absolute values of deviations from a reference surface to a specific surface and is defined by Formula 1.

[FORMULA 1]

$$Ra = \frac{1}{S_0}\int_{y_1}^{y_2}\int_{x_1}^{x_2}|f(x,y) - Z_0|\,dx\,dy \quad (1)$$

Here, the specific surface is a surface which is a target of roughness measurement, and is a quadrilateral region which is specified by four points represented by the coordinates $(x_1, y_1, f(x_1,y_1))$, $f(x_1, y_2, f(x_1,y_2))$, $f(x_2, y_1, f(x_2,y_1))$, and $(x_2, y_2, f(x_2,y_2))$. $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

The conductive film 121a, the conductive film 122a, and the conductive film 123a may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The insulating film 102 may be formed of a single layer or a stacked layer of an insulating film(s) containing any of aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

In the case where the semiconductor film 110a is an oxide semiconductor film, the insulating film 102 preferably contains excess oxygen. Released oxygen allows a reduction of oxygen vacancies in the semiconductor film 110a and in the vicinity of the semiconductor film 110a.

In an oxide semiconductor film which contains sufficient oxygen and is highly purified, the band gap is approximately 2.8 eV to 3.2 eV, the density of minority carriers is as extremely low as approximately $10^{-9}$/cm$^3$, and majority carriers flow only from a source of a transistor. Therefore, avalanche breakdown does not occur in the transistor including the oxide semiconductor film.

In the transistor including the oxide semiconductor film, the electric field of a gate electrode makes a channel region of the transistor fully depleted; therefore, for example, an off-state current with a channel length of 3 μm and a channel width of 1 μm can be lower than or equal to $10^{-23}$ A at 85° C. to 95° C. and further lower than or equal to $10^{-25}$ A at room temperature.

For example, when a transistor with an extremely low off-state current is used in a memory cell, data can be held for a longer period of time. That is, the frequency of refresh operation can be reduced, leading to a reduction in power consumption. For example, when a memory cell is composed of transistors each having an off-state current of $1\times10^{-21}$ A to $1\times10^{-25}$ A, data can be held for several days to several decades without supply of power.

The conductive film 131, the conductive film 132, the conductive film 133, and the conductive film 134 may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The insulating film 103 may be formed of a single layer or a stacked layer of an insulating film(s) containing any of aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

In the case where the semiconductor film 110a or/and the semiconductor film 110b is/are an oxide semiconductor film, the insulating film 103 preferably contains excess oxygen. Released oxygen allows a reduction of oxygen vacancies in the semiconductor film 110a and in the vicinity of the semiconductor film 110a.

The insulating film 104 may be formed of a single layer or a stacked layer of an insulating film(s) containing any of aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

In the case where the semiconductor film 110b is an oxide semiconductor film, the insulating film 104 preferably contains excess oxygen. Released oxygen allows a reduction of oxygen vacancies in the semiconductor film 110b and in the vicinity of the semiconductor film 110b.

The conductive film 121b, the conductive film 122b, and the conductive film 123b may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

For the semiconductor film 110b, a semiconductor film such as an oxide semiconductor film, an amorphous silicon film, a polycrystalline silicon film, or a single-crystal silicon film may be used. It is preferable to use an oxide semiconductor film for the semiconductor film 110b.

The insulating film 105 may be formed of a single layer or a stacked layer of an insulating film(s) containing any of aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

In the case where the semiconductor film 110b is an oxide semiconductor film, the insulating film 105 preferably contains excess oxygen. Released oxygen allows a reduction of oxygen vacancies in the semiconductor film 110b and in the vicinity of the semiconductor film 110b.

The conductive film 160b may be formed of a single layer or a stacked layer of a simple substance selected from Al, Ti, Cr, Co, Ni, Cu, Y, Zr, Mo, Ag, Ta, and W; a nitride containing one or more kinds of the above substances; an oxide containing one or more kinds of the above substances; or an alloy containing one or more kinds of the above substances.

The insulating film 106 may be formed of a single layer or a stacked layer of an insulating film(s) containing any of aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

It is preferable that the insulating film 101 be sufficiently flat. The insulating film 106 may contain excess oxygen.

Next, a method for manufacturing the semiconductor device illustrated in FIG. 1B will be described with reference to FIGS. 3A to 3E, FIGS. 4A to 4D, FIGS. 5A to 5C, FIGS. 6A to 6C, and FIGS. 7A and 7B.

Figure 3A:
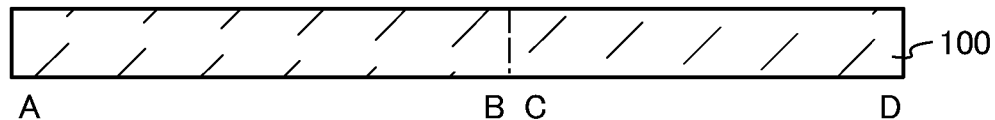
FIGS. 3A to 3E are cross-sectional views illustrating an example of a method for manufacturing a semiconductor device of one embodiment of the present invention.

First, a substrate 100 is prepared (see FIG. 3A).

Then, a conductive film to be the conductive film 160a is deposited. The conductive film to be the conductive film 160a may be any of the conductive films mentioned for the conductive film 160a, and deposited by a sputtering method, a chemical vapor deposition (CVD) method, a molecular beam epitaxy (MBE) method, an atomic layer deposition (ALD) method, or a pulsed laser deposition (PLD) method.

Figure 3B:
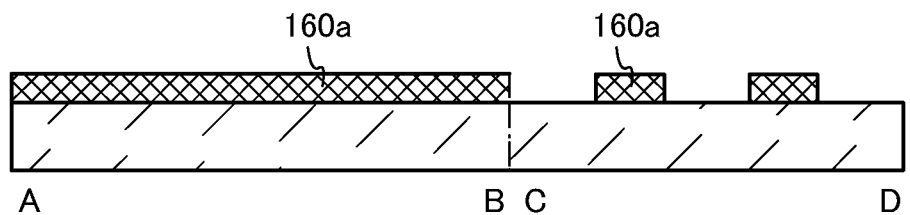

Next, the conductive film to be the conductive film 160a is processed to form the conductive film 160a (see FIG. 3B).

Figure 3C:
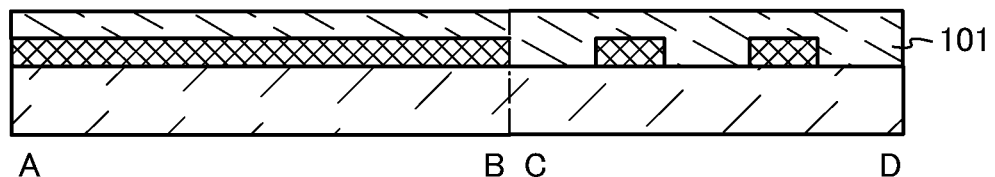

Then, the insulating film 101 is deposited (see FIG. 3C). The insulating film 101 may be any of the insulating films mentioned for the insulating film 101, and deposited by a sputtering method, a CVD method, an MBE method, an ALD method, or a PLD method.

The insulating film 101 may be subjected to planarization treatment after being deposited. The planarization treatment may be performed by chemical mechanical polishing (CMP) treatment or the like.

After the insulating film 101 is deposited, dehydration treatment or dehydrogenation treatment is preferably performed. The dehydration treatment or the dehydrogenation treatment can be performed by, for example, heat treatment at higher than or equal to 250° C. and lower than or equal to 650° C., preferably higher than or equal to 300° C. and lower than or equal to 500° C. The heat treatment is performed in an inert gas atmosphere, or an atmosphere containing an oxidizing gas at 10 ppm or more, preferably 1% or more, and more preferably 10% or more, or under reduced pressure. Alternatively, the heat treatment may be performed in such a manner that heat treatment is performed in an inert gas atmosphere, and then another heat treatment is performed in an atmosphere containing an oxidizing gas at 10 ppm or more, preferably 1% or more, and more preferably 10% or more in order to compensate desorbed oxygen. The dehydration treatment or the dehydrogenation treatment can also be performed by plasma treatment, UV treatment, or chemical treatment. By performing the dehydration treatment or the dehydrogenation treatment after the deposition of the insulating film 101, in the case where a semiconductor film to be the semiconductor film 110a is an oxide semiconductor film, variation in the electrical characteristics of the transistor can be prevented, which is due to hydrogen moving to the semiconductor film to be the semiconductor film 110a and the vicinity of the semiconductor film to be the semiconductor film 110a. The above described dehydration treatment or the dehydrogenation treatment is preferably performed after the deposition or formation of each insulating film (the insulating film 101, the insulating film 102, the insulating film 103, the insulating film 104, the insulating film 105, the insulating film 106, and the like).

Next, the semiconductor film to be the semiconductor film 110a is deposited. The semiconductor film to be the semiconductor film 110a may be any of the semiconductor films mentioned for the semiconductor film 110a, and deposited by a sputtering method, a CVD method, an MBE method, an ALD method, or a PLD method.

The semiconductor film to be the semiconductor film 110a may be subjected to heat treatment after being deposited. In the case where the semiconductor film to be the semiconductor film 110a is an oxide semiconductor film and the insulating film 101 contains excess oxygen, oxygen is released from the insulating film 101 by the heat treatment, resulting in a reduction of oxygen vacancies in the semiconductor film to be the semiconductor film 110a and in the vicinity of the semiconductor film to be the semiconductor film 110a. Thus, the electrical characteristics of the transistor can be improved.

Figure 3D:
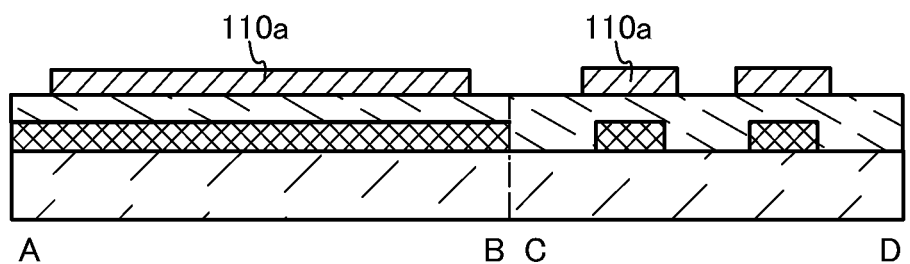

The semiconductor film to be the semiconductor film 110a is processed to form the semiconductor film 110a (see FIG. 3D).

Figure 3E:
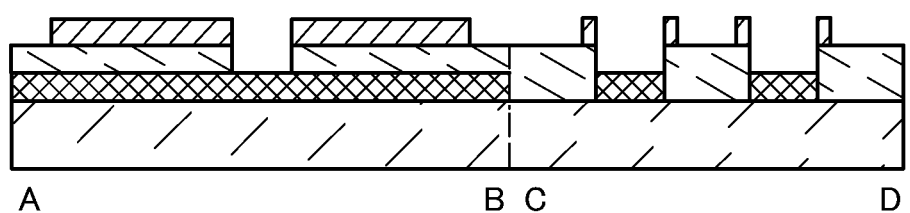

The semiconductor film 110a and the insulating film 101 are processed to form openings exposing the conductive film 160a (see FIG. 3E).

After that, a conductive film to be the conductive film 121a, the conductive film 122a, and the conductive film 123a is deposited. The conductive film to be the conductive film 121a, the conductive film 122a, and the conductive film 123a may be any of the conductive films mentioned for the conductive film 121a, the conductive film 122a, and the conductive film 123a, and deposited by a sputtering method, a CVD method, an MBE method, an ALD method, or a PLD method.

Figure 4A:
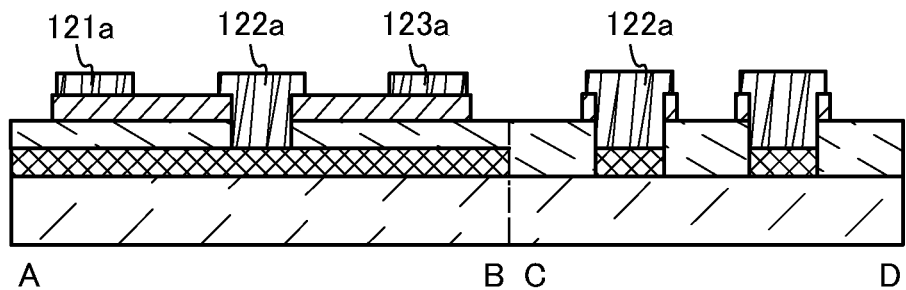
FIGS. 4A to 4D are cross-sectional views illustrating an example of a method for manufacturing a semiconductor device of one embodiment of the present invention.

The conductive film to be the conductive film 121a, the conductive film 122a, and the conductive film 123a is processed to form the conductive film 121a, the conductive film 122a, and the conductive film 123a (see FIG. 4A).

Figure 4B:
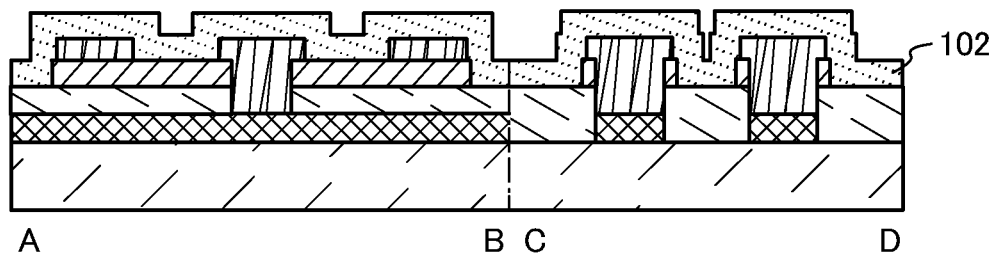

Next, the insulating film 102 is deposited (see FIG. 4B). The insulating film 102 may be any of the insulating films mentioned for the insulating film 102, and deposited by a sputtering method, a CVD method, an MBE method, an ALD method, or a PLD method.

Then, a conductive film to be the conductive film 131, the conductive film 132, the conductive film 133, and the conductive film 134 is deposited. The conductive film to be the conductive film 131, the conductive film 132, the conductive film 133, and the conductive film 134 may be any of the conductive films mentioned for the conductive film 131, the conductive film 132, the conductive film 133, and the conductive film 134, and deposited by a sputtering method, a CVD method, an MBE method, an ALD method, or a PLD method.

Figure 4C:
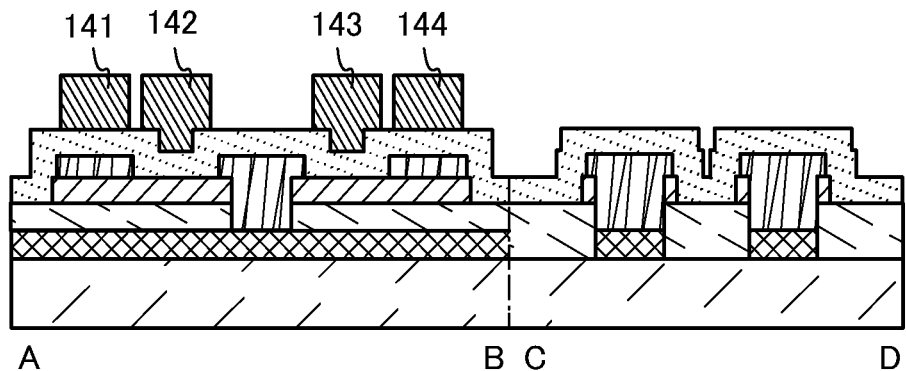

The conductive film to be the conductive film 131, the conductive film 132, the conductive film 133, and the conductive film 134 is processed to form a conductive film 141, a conductive film 142, a conductive film 143, and a conductive film 144 (see FIG. 4C).

Figure 4D:
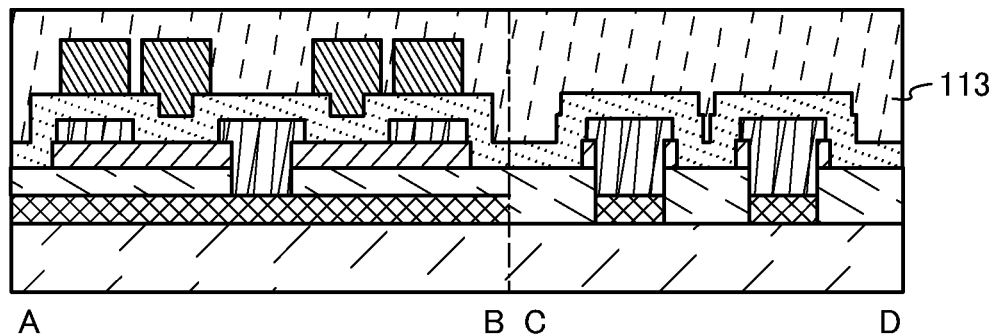

After that, an insulating film 113 is deposited (see FIG. 4D). The insulating film 113 may be any of the insulating films mentioned for the insulating film 103, and deposited by a sputtering method, a CVD method, an MBE method, an ALD method, or a PLD method. Note that the insulating film 113 is deposited to be thicker than the conductive film that is to be the conductive film 131, the conductive film 132, the conductive film 133, and the conductive film 134. As a result, with planarization treatment performed later, the top surfaces of the conductive film 131, the conductive film 132, the conductive film 133, and the conductive film 134 can be made level with the top surface of the insulating film 113.

Planarization treatment is performed from the top surface side of the insulating film 113, and at the same time, the conductive film 141, the conductive film 142, the conductive film 143, and the conductive film 144 are processed. The planarization treatment makes it possible to form the insulating film 103, the conductive film 131, the conductive film 132, the conductive film 133, and the conductive film 134 whose top surfaces are level with each other (see FIG. 5A). The drawings show the conductive film 141, the conductive film 142, the conductive film 143, and the conductive film 144 which are polished by the planarization treatment to be thinner; however, one embodiment of the present invention is not limited to this example and the thicknesses of the conductive film 141, the conductive film 142, the conductive film 143, and the conductive film 144 are not necessarily reduced much.

Figure 5A:
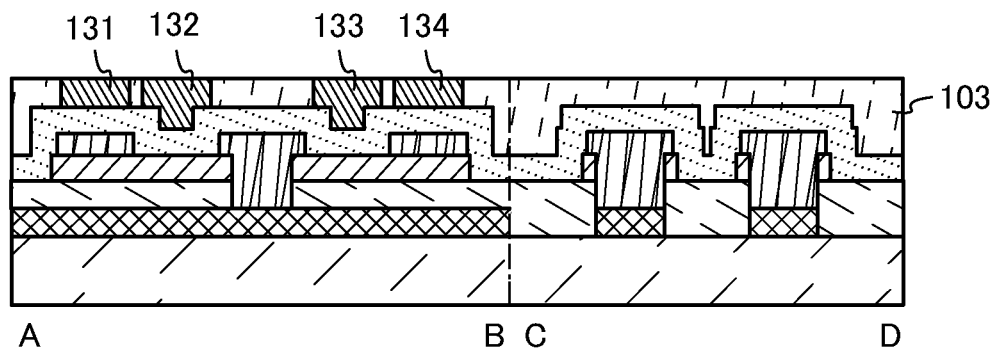
FIGS. 5A to 5C are cross-sectional views illustrating an example of a method for manufacturing a semiconductor device of one embodiment of the present invention.
Figure 5B:
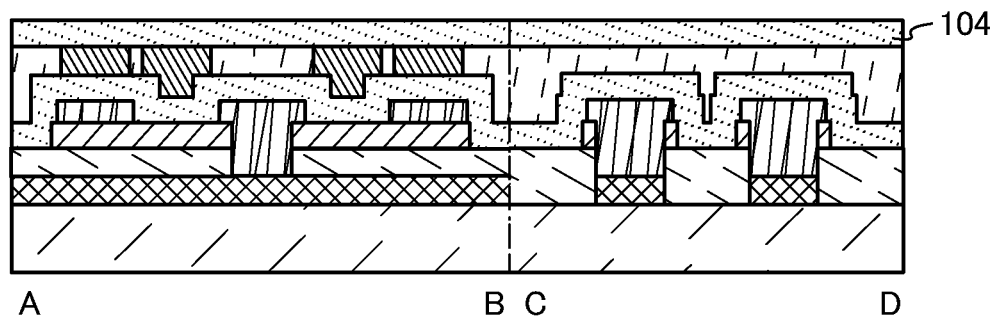

Then, the insulating film 104 is deposited (see FIG. 5B). The insulating film 104 may be any of the insulating films mentioned for the insulating film 104, and deposited by a sputtering method, a CVD method, an MBE method, an ALD method, or a PLD method.

Next, a conductive film to be the conductive film 121$b$, the conductive film 122$b$, and the conductive film 123$b$ is deposited. The conductive film to be the conductive film 121$b$, the conductive film 122$b$, and the conductive film 123$b$ may be any of the conductive films mentioned for the conductive film 121$b$, the conductive film 122$b$, and the conductive film 123$b$, and deposited by a sputtering method, a CVD method, an MBE method, an ALD method, or a PLD method.

Figure 5C:
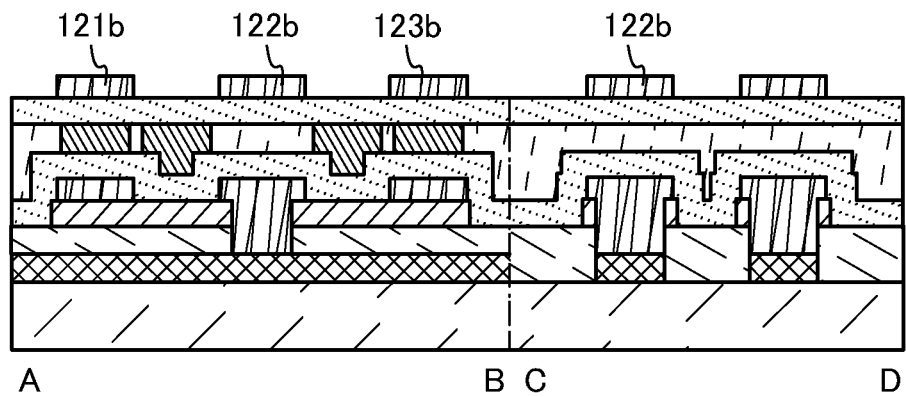

The conductive film to be the conductive film 121$b$, the conductive film 122$b$, and the conductive film 123$b$ is processed to form the conductive film 121$b$, the conductive film 122$b$, and the conductive film 123$b$ (see FIG. 5C).

Then, a semiconductor film to be the semiconductor film 110$b$ is deposited. The semiconductor film to be the semiconductor film 110$b$ may be any of the semiconductor films mentioned for the semiconductor film 110$b$, and deposited by a sputtering method, a CVD method, an MBE method, an ALD method, or a PLD method.

The semiconductor film to be the semiconductor film 110$b$ may be subjected to heat treatment after being deposited. In the case where the semiconductor film to be the semiconductor film 110$b$ is an oxide semiconductor film and the insulating film 104 contains excess oxygen, oxygen is released from the insulating film 104 by the heat treatment, resulting in a reduction of oxygen vacancies in the semiconductor film to be the semiconductor film 110$b$ and in the vicinity of the semiconductor film to be the semiconductor film 110$b$. Thus, the electrical characteristics of the transistor can be improved.

Figure 6A:
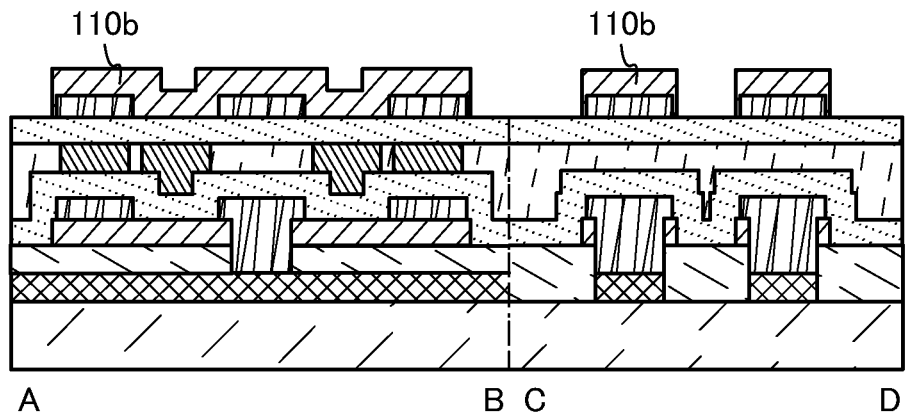
FIGS. 6A to 6C are cross-sectional views illustrating an example of a method for manufacturing a semiconductor device of one embodiment of the present invention.

The semiconductor film to be the semiconductor film 110$b$ is processed to form the semiconductor film 110$b$ (see FIG. 6A).

Figure 6B:
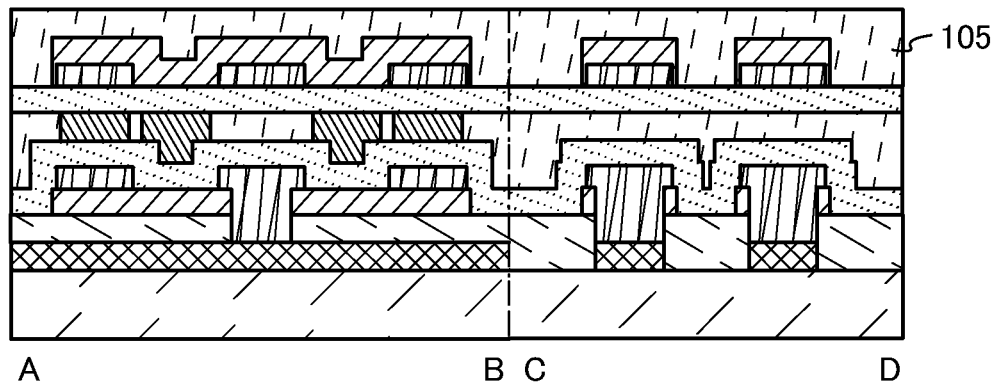

Next, the insulating film 105 is deposited (see FIG. 6B). The insulating film 105 may be any of the insulating films mentioned for the insulating film 105, and deposited by a sputtering method, a CVD method, an MBE method, an ALD method, or a PLD method.

Figure 6C:
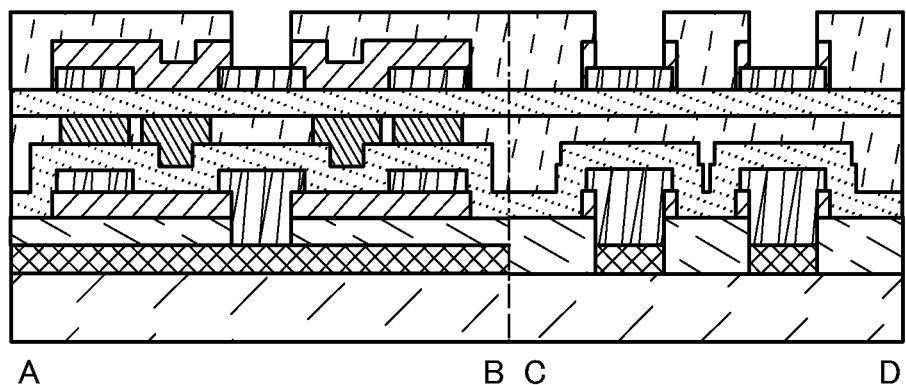

The semiconductor film 110$b$ and the insulating film 105 are processed to form openings exposing the conductive film 122$b$ (see FIG. 6C).

Then, a conductive film to be the conductive film 160$b$ is deposited. The conductive film to be the conductive film 160$b$ may be any of the conductive films mentioned for the conductive film 160$b$, and deposited by a sputtering method, a CVD method, an MBE method, an ALD method, or a PLD method.

Figure 7A:
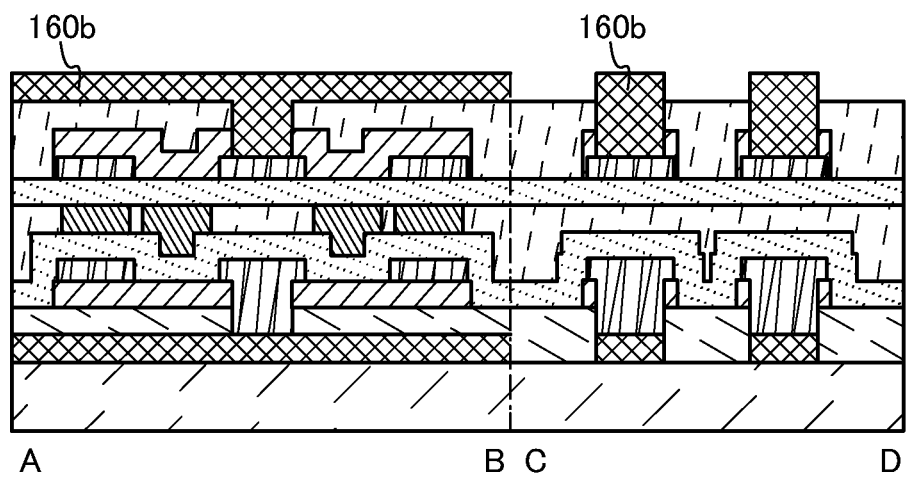
FIGS. 7A and 7B are cross-sectional views illustrating an example of a method for manufacturing a semiconductor device of one embodiment of the present invention.

The conductive film to be the conductive film 160$b$ is processed to form the conductive film 160$b$ (see FIG. 7A).

Figure 7B:
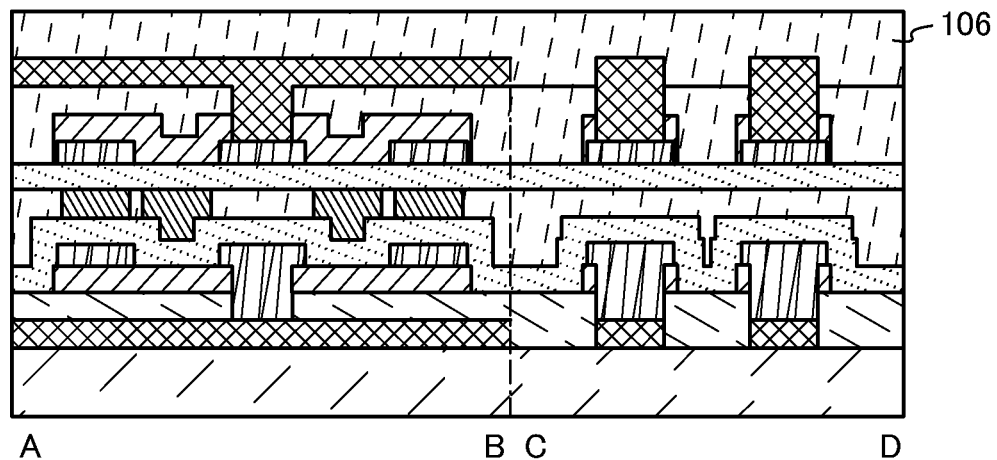

Next, the insulating film 106 is deposited (see FIG. 7B). The insulating film 106 may be any of the insulating films mentioned for the insulating film 106, and deposited by a sputtering method, a CVD method, an MBE method, an ALD method, or a PLD method.

The insulating film 106 may be subjected to planarization treatment after being deposited.

The semiconductor device illustrated in FIG. 1B can be manufactured in the aforementioned manner.

When the word line, the capacitor line, and the bit line are shared as described in this embodiment, an increase in the number of steps and layers can be suppressed and a semiconductor device with high productivity and high yield can be provided. In addition, the area per memory cell can be reduced, leading to high integration of a semiconductor device. Furthermore, since a transistor with an extremely low off-state current is used in a memory cell, a semiconductor device with low power consumption can be provided.

This embodiment can be implemented in combination with the other embodiments as appropriate.

Embodiment 2

In this embodiment, a semiconductor device will be described with reference to

Figure 8:
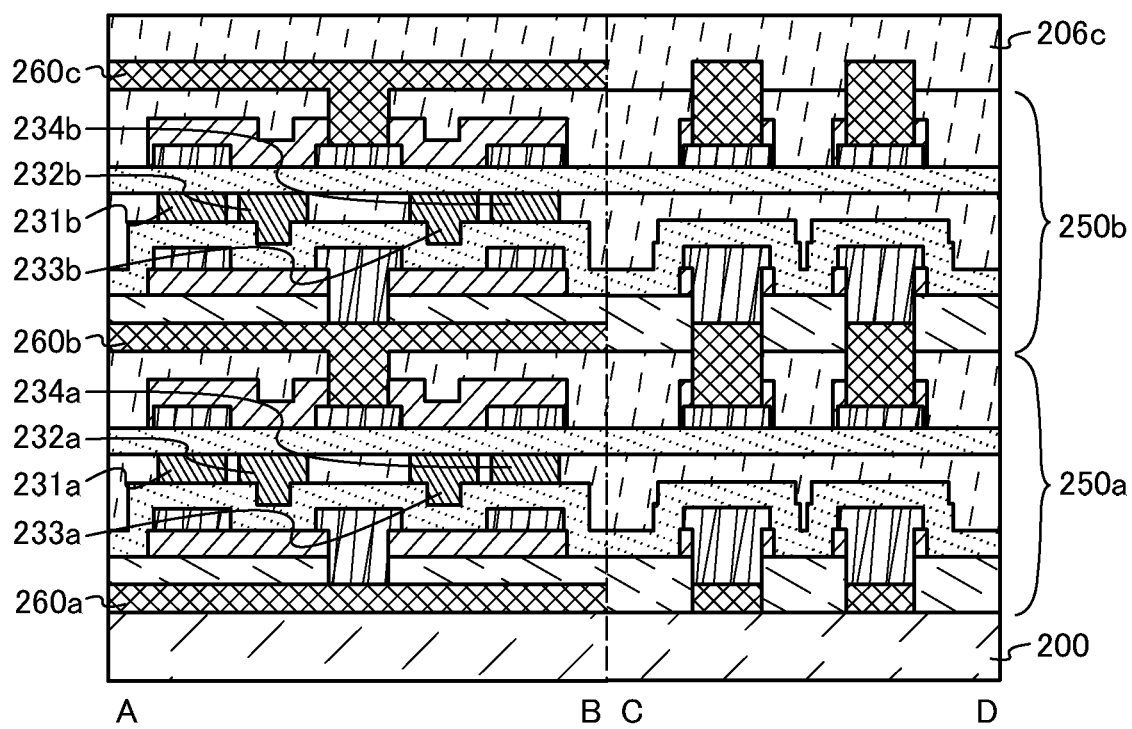
FIG. 8 is a cross-sectional view illustrating an example of a semiconductor device of one embodiment of the present invention.
Figure 9:
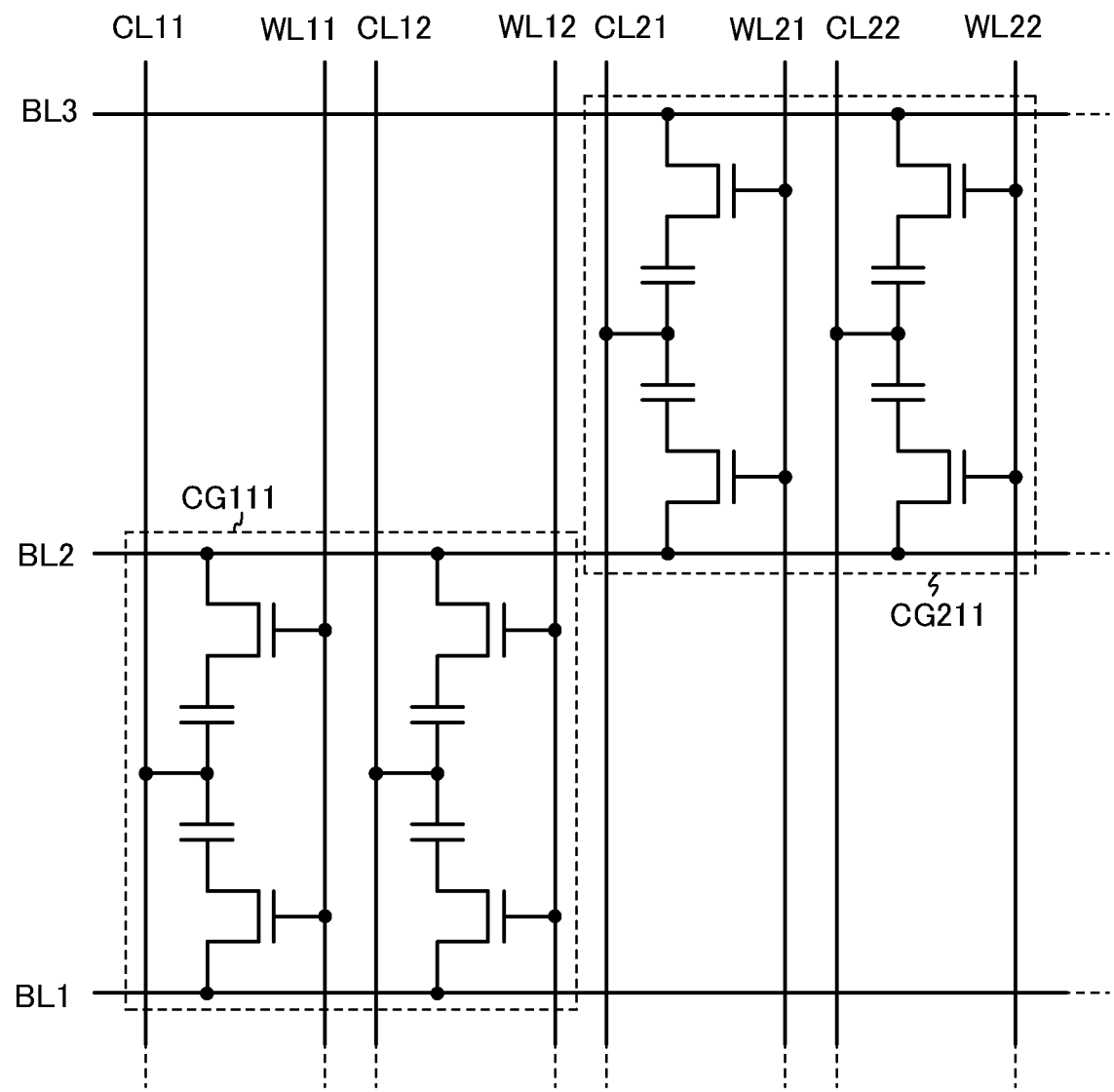
FIG. 9 is a circuit diagram illustrating an example of a semiconductor device of one embodiment of the present invention.
Figure 10:
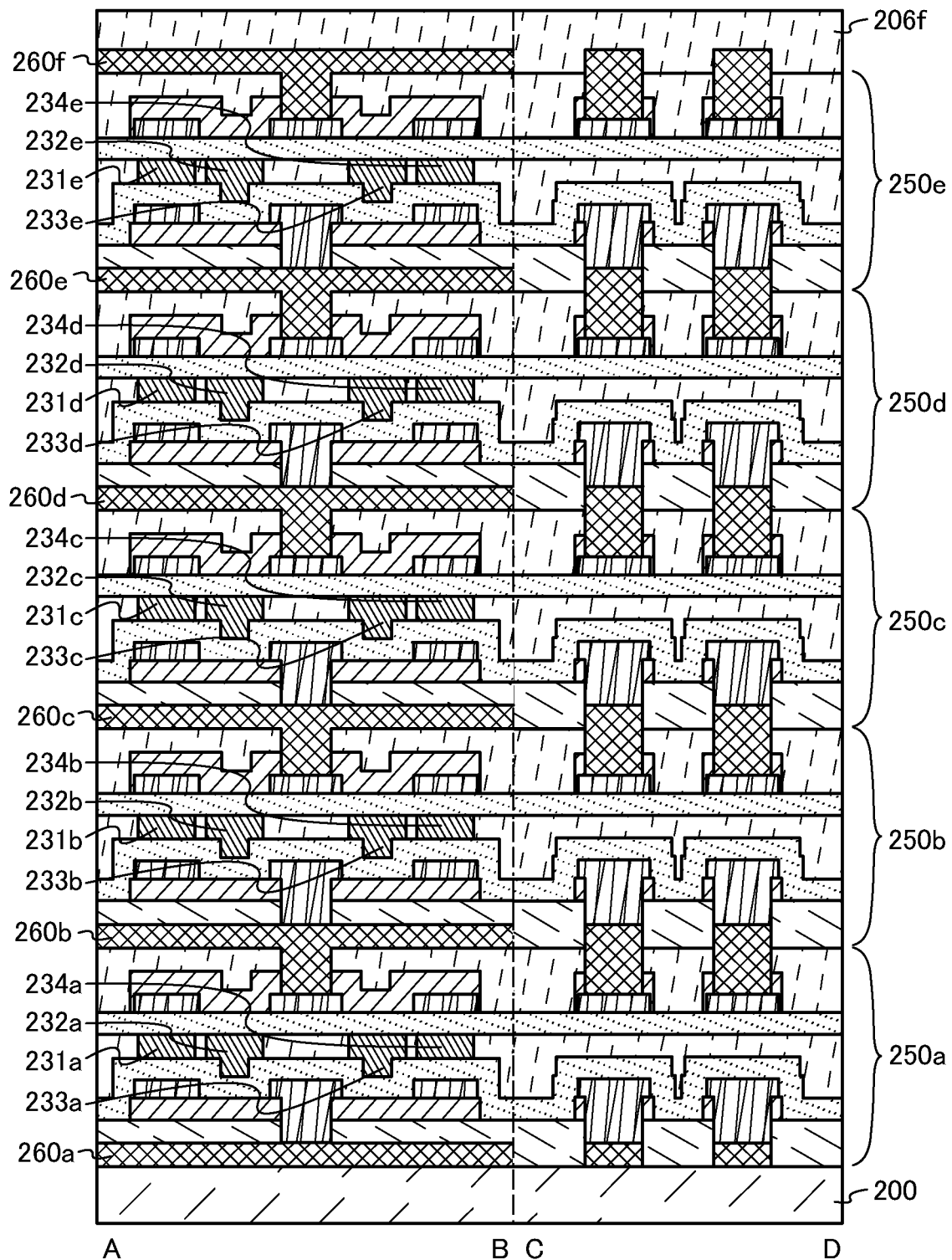
FIG. 10 is a cross-sectional view illustrating an example of a semiconductor device of one embodiment of the present invention.

FIG. 8, FIG. 9, and FIG. 10, the semiconductor device including a plurality of structures of semiconductor device described in Embodiment 1 which overlap with each other.

FIG. 8 is a cross-sectional view of the semiconductor device shown in this embodiment. Since a top view of the semiconductor device is the same as FIG. 1A except for reference numerals, description thereof is omitted. FIG. 8 illustrates a cross-section A-B and a cross-section C-D corresponding to the dashed-dotted line A-B and the dashed-dotted line C-D of FIG. 1A, respectively.

In the semiconductor device in FIG. 8, a conductive film 260a corresponds to the conductive film 160a, a conductive film 231a corresponds to the conductive film 131, a conductive film 232a corresponds to the conductive film 132, a conductive film 233a corresponds to the conductive film 133, a conductive film 234a corresponds to the conductive film 134, and a conductive film 260b corresponds to the conductive film 160b. Embodiment 1 is referred to for these conductive films. A substrate 200 corresponds to the substrate 100, and Embodiment 1 is referred to for the substrate 200. Embodiment 1 is also referred to for the other layers corresponding to those in the semiconductor device shown in Embodiment 1.

Layers between the conductive film 260a and the conductive film 260b are considered as a group and referred to as a structure 250a.

The description of the conductive film 131, the conductive film 132, the conductive film 133, and the conductive film 134 is referred to for a conductive film 231b, a conductive film 232b, a conductive film 233b, and a conductive film 234b, respectively.

The description of the conductive film 260a and the conductive film 260b is referred to for a conductive film 260c.

Layers between the conductive film 260b and the conductive film 260c are considered as a group and referred to as a structure 250b.

The structure 250a and the structure 250b can be manufactured to have a similar structure. The description of the semiconductor device shown in Embodiment 1 is referred to for the details of the structure 250a and the structure 250b.

An insulating film 206c is provided over the structure 250b. The description of the insulating film 106 is referred to for the insulating film 206c.

That is, the semiconductor device illustrated in FIG. 8 has a structure in which the two semiconductor devices shown in Embodiment 1 overlap with each other.

In the semiconductor device illustrated in FIG. 8, four memory cells overlap with each other in an area of $6F^2$. In other words, one memory cell has a size of 1.5 $F^2$, thereby realizing a further reduction in the size of the memory cell as compared to that in the semiconductor device shown in Embodiment 1.

The conductive film 260a serves as a first bit line.
The conductive film 260b serves as a second bit line.
The conductive film 260c serves as a third bit line.
The conductive film 232a serves as a first word line.
The conductive film 233a serves as a second word line.
The conductive film 232b serves as a third word line.
The conductive film 233b serves as a fourth word line.
The conductive film 231a serves as a first capacitor line.
The conductive film 234a serves as a second capacitor line.
The conductive film 231b serves as a third capacitor line.
The conductive film 234b serves as a fourth capacitor line.

FIG. 9 is a circuit diagram corresponding to the semiconductor device illustrated in FIG. 8.

The semiconductor device illustrated in FIG. 9 includes a cell group CG111 (having a structure similar to that of the cell group CG111 shown in Embodiment 1, here, equivalent to the structure 250a), a cell group CG211 (equivalent to the structure 250b), a bit line BL1 (equivalent to the first bit line), a bit line BL2 (equivalent to the second bit line), a bit line BL3 (equivalent to the third bit line), a word line WL11 (equivalent to the first word line), a word line WL12 (equivalent to the second word line), a word line WL21 (equivalent to the third word line), a word line WL22 (equivalent to the fourth word line), a capacitor line CL11 (equivalent to the first capacitor line), a capacitor line CL12 (equivalent to the second capacitor line), a capacitor line CL21 (equivalent to the third capacitor line), and a capacitor line CL22 (equivalent to the fourth capacitor line).

The bit line BL2 is shared between the cell group CG111 and the cell group CG211.

A semiconductor device described below with reference to FIG. 10 includes five semiconductor devices shown in Embodiment 1 which overlap with each other.

FIG. 10 is a cross-sectional view of the semiconductor device shown in this embodiment. Since a top view of the semiconductor device is the same as FIG. 1A except for reference numerals, description thereof is omitted. FIG. 10 illustrates a cross-section A-B and a cross-section C-D corresponding to the dashed-dotted line A-B and the dashed-dotted line C-D of FIG. 1A, respectively.

The description of the semiconductor device illustrated in FIG. 8 is referred to for part of the semiconductor device illustrated in FIG. 10, which ranges from the substrate 200 to the conductive film 260c.

The description of the conductive film 131, the conductive film 132, the conductive film 133, and the conductive film 134 is referred to for a conductive film 231c, a conductive film 232c, a conductive film 233c, and a conductive film 234c, respectively. The description of the conductive film 131, the conductive film 132, the conductive film 133, and the conductive film 134 is referred to for a conductive film 231d, a conductive film 232d, a conductive film 233d, and a conductive film 234d, respectively. The description of the conductive film 131, the conductive film 132, the conductive film 133, and the conductive film 134 is referred to for a conductive film 231e, a conductive film 232e, a conductive film 233e, and a conductive film 234e, respectively.

The description of the conductive film 260a, the conductive film 260b, and the conductive film 260c is referred to for a conductive film 260d, a conductive film 260e, and a conductive film 260f, respectively.

Layers between the conductive film 260c and the conductive film 260d are considered as a group and referred to as a structure 250c.

Layers between the conductive film 260d and the conductive film 260e are considered as a group and referred to as a structure 250d.

Layers between the conductive film 260e and the conductive film 260f are considered as a group and referred to as a structure 250e.

The structure 250c, the structure 250d, and the structure 250e can be manufactured to have a similar structure. The description of the semiconductor device shown in Embodiment 1 is referred to for the details of the structure 250c, the structure 250d, and the structure 250e.

A bit line is shared between the structure 250a and the structure 250b. A bit line is shared between the structure 250b and the structure 250c. A bit line is shared between the structure 250c and the structure 250d. A bit line is shared between the structure 250d and the structure 250e.

In the semiconductor device illustrated in FIG. 10, ten memory cells overlap with each other in an area of $6F^2$. In other words, one memory cell has a size of 0.6 $F^2$, thereby realizing a further reduction in the size of the memory cell as compared to that in the semiconductor device illustrated in FIG. 8.

One embodiment of the present invention is not limited to the semiconductor device shown in this embodiment, in which two or five structures similar to those in the semiconductor device shown in Embodiment 1 overlap with each other. For example, in the semiconductor device, 2 to 50, 2 to 20, or 2 to 10 structures similar to those in the semiconductor device shown in Embodiment 1 may overlap with each other.

The number of semiconductor devices and the connection relationship among transistors, capacitors, bit lines, word lines, and capacitor lines, are denoted by variables as follows. In a semiconductor device, n structures (n is a natural number) similar to those in the semiconductor device shown in Embodiment 1 overlap with each other. The semiconductor device includes first to 2n-th word lines, first to 2n-th capacitor lines, first to (n+1)th bit lines, first to 4n-th transistors each of which includes a gate, a source, and a drain, and first to 4n-th capacitors. A (4m−3)th transistor (m is a natural number of n or less) and a (4m−1)th transistor at least partly overlap with each other, and gates of the (4m−3)th transistor and the (4m−1)th transistor are connected to a (2m−1)th word line. A (4m−2)th transistor and a 4m-th transistor at least partly overlap with each other, and gates of the (4m−2)th transistor and the 4m-th transistor are connected to a 2m-th word line. A (4m−3)th capacitor is formed between at least part of a (2m−1)th capacitor line and a drain of the (4m−3)th transistor, and a (4m−1)th capacitor is formed between at least part of the (2m−1)th capacitor line and a drain of the (4m−1)th transistor. A (4m−2)th capacitor is formed between at least part of a 2m-th capacitor line and the drain of the (4m−2)th transistor, and a 4m-th capacitor is formed between at least part of the 2m-th capacitor line and a drain of the 4m-th transistor. An m-th bit line is connected to sources of the (4m−3)th transistor and the (4m−2)th transistor, and a (m+1)th bit line is connected to sources of the (4m−1)th transistor and the 4m-th transistor.

When the word line, the capacitor line, and the bit line are shared as described in this embodiment, an increase in the number of steps and layers can be suppressed and a semiconductor device with high productivity and high yield can be provided. In addition, the area per memory cell can be reduced, leading to high integration of a semiconductor device. Furthermore, since a transistor with an extremely low off-state current is used in a memory cell, a semiconductor device with low power consumption can be provided.

This embodiment can be implemented in combination with the other embodiments as appropriate.

Embodiment 3

A central processing unit (CPU) of one embodiment of the present invention can be formed with the use of the semiconductor device described in Embodiment 1 or Embodiment 2 for at least part of the CPU.

Figure 11A:
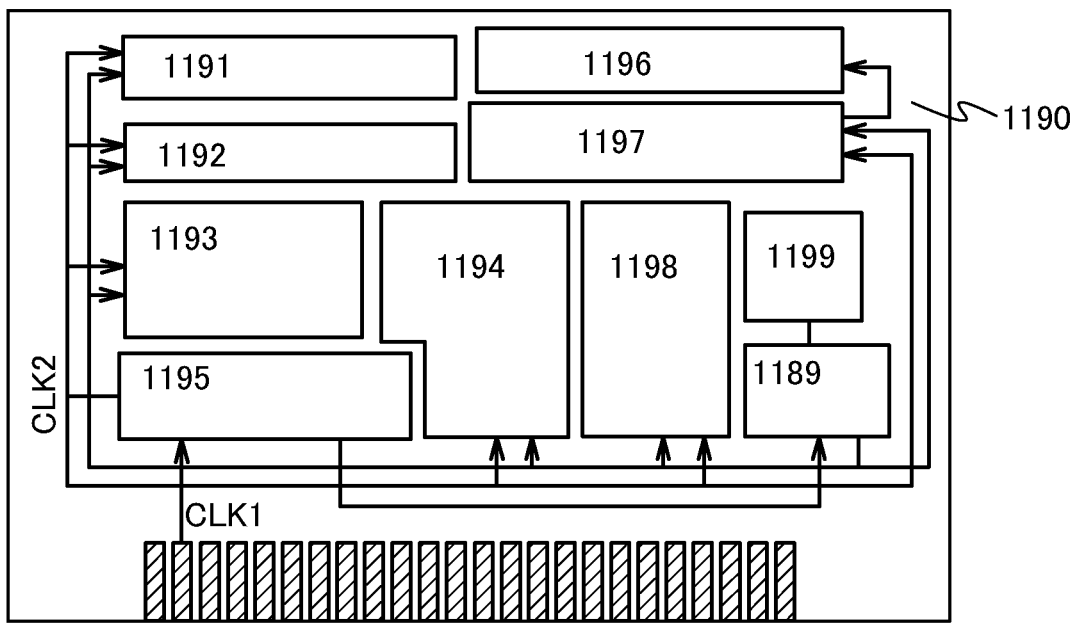
FIG. 11A is a block diagram illustrating a specific example of a CPU of one embodiment of the present invention.

FIG. 11A is a block diagram illustrating a specific configuration of a CPU. The CPU illustrated in FIG. 11A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used for the substrate 1190. The ROM 1199 and the ROM interface 1189 may be provided over a separate chip. Obviously, the CPU illustrated in FIG. 11A is just an example in which the structure is simplified, and an actual CPU may have various structures depending on the application.

An instruction that is input to the CPU through the bus interface 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 11A, a memory element is provided in the register 1196. As the memory element in the register 1196, the semiconductor device described in Embodiment 1 or Embodiment 2 can be used.

In the CPU illustrated in FIG. 11A, the register controller 1197 selects operation of holding data in the register 1196 in accordance with an instruction from the ALU 1191. That is, the register controller 1197 selects whether data is held in a flip flop or a capacitor which is in the memory element included in the register 1196. When data is held in the flip flop, a power supply voltage is supplied to the memory element in the register 1196. When data is held in the capacitor, the data in the capacitor is rewritten, and supply of the power supply voltage to the memory element in the register 1196 can be stopped.

Figure 11B:
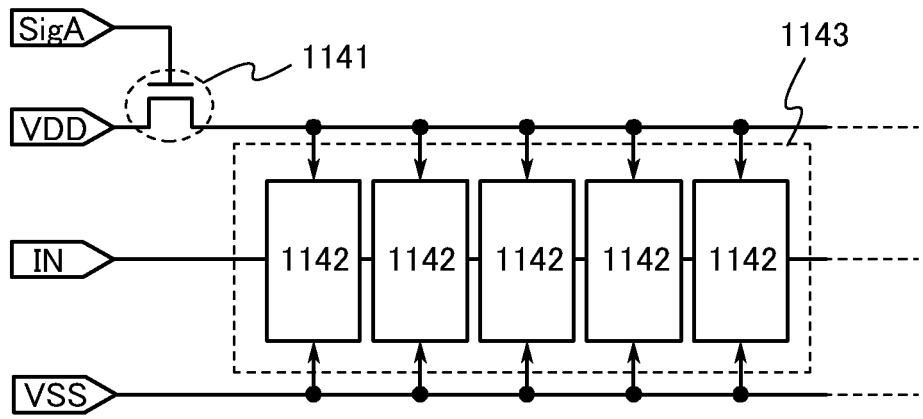
FIGS. 11B and 11C are circuit diagrams each illustrating part of the CPU.
Figure 11C:
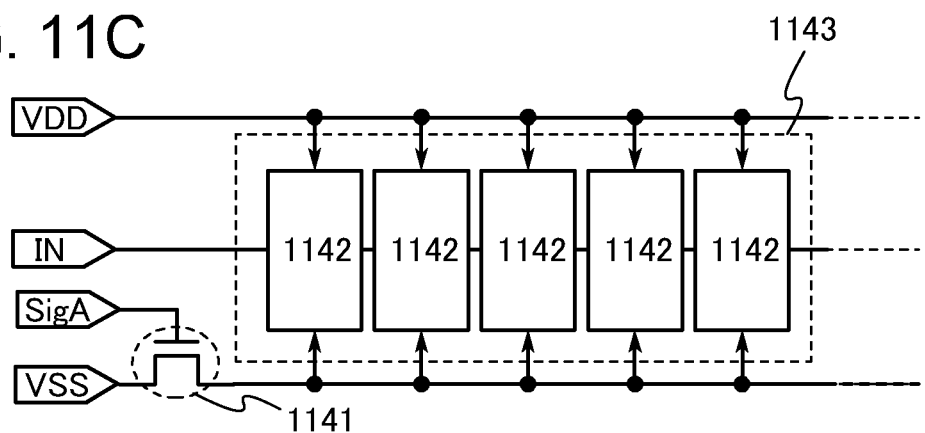

The power supply can be stopped by providing a switching element between a memory element group and a node to which a power supply potential VDD or a power supply potential VSS is supplied, as illustrated in FIG. 11B or FIG. 11C. Circuits illustrated in FIGS. 11B and 11C are described below.

FIGS. 11B and 11C each illustrate an example of a configuration using a transistor with an extremely low off-state current as a switching element for controlling supply of a power supply potential to a memory element.

The memory device illustrated in FIG. 11B includes a switching element 1141 and a memory element group 1143 including a plurality of memory elements 1142. Specifically, as each of the memory elements 1142, the semiconductor device described in Embodiment 1 or Embodiment 2 can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and the low-level power supply potential VSS.

In FIG. 11B, a transistor with an extremely low off-state current is used as the switching element 1141, and the switching of the transistor is controlled by a signal SigA supplied to a gate thereof.

Note that FIG. 11B illustrates a structure in which the switching element 1141 includes only one transistor; however, one embodiment of the present invention is not limited thereto. The switching element 1141 may include a plurality of transistors. In the case where the switching element 1141 includes a plurality of transistors functioning as switching elements, the plurality of transistors may be connected to each other in parallel, in series, or in combination of parallel connection and series connection.

FIG. 11C illustrates an example of a memory device in which each of the memory elements 1142 included in the memory element group 1143 is supplied with the low-level power supply potential VSS through the switching element 1141. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that power consumption can be reduced.

Although the CPU is given as an example, the semiconductor memory device can also be applied to an LSI such as a digital signal processor (DSP), a custom LSI, or a field programmable gate array (FPGA).

This embodiment can be implemented in combination with the above embodiments as appropriate.

Embodiment 4

In this embodiment, examples of an electronic device according to one embodiment of the present invention will be described.

Figure 12A:
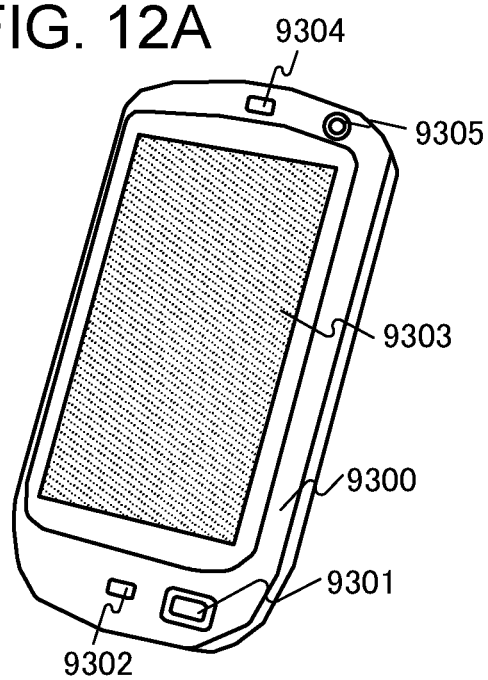
FIGS. 12A to 12C are perspective views each illustrating an example of an electronic device of one embodiment of the present invention.

FIG. 12A illustrates a portable information terminal The portable information terminal illustrated in FIG. 12A includes a housing 9300, a button 9301, a microphone 9302, a display portion 9303, a speaker 9304, and a camera 9305, and has a function as a cellular phone. The semiconductor device of one embodiment of the present invention can be applied to an arithmetic unit, a wireless circuit, or a memory circuit inside the main body.

Figure 12B:
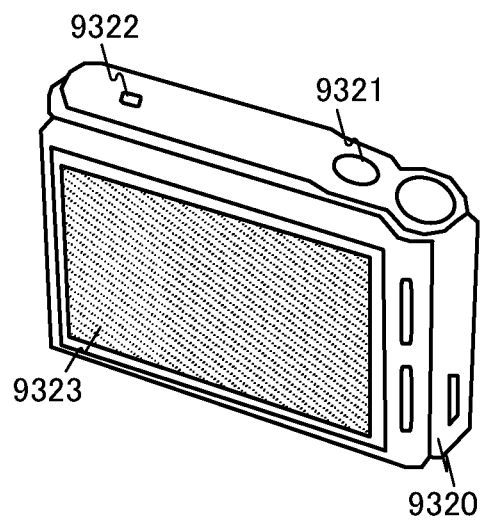

FIG. 12B illustrates a digital still camera. The digital still camera illustrated in FIG. 12B includes a housing 9320, a button 9321, a microphone 9322, and a display portion 9323. The semiconductor device of one embodiment of the present invention can be applied to a memory circuit or an image sensor.

Figure 12C:
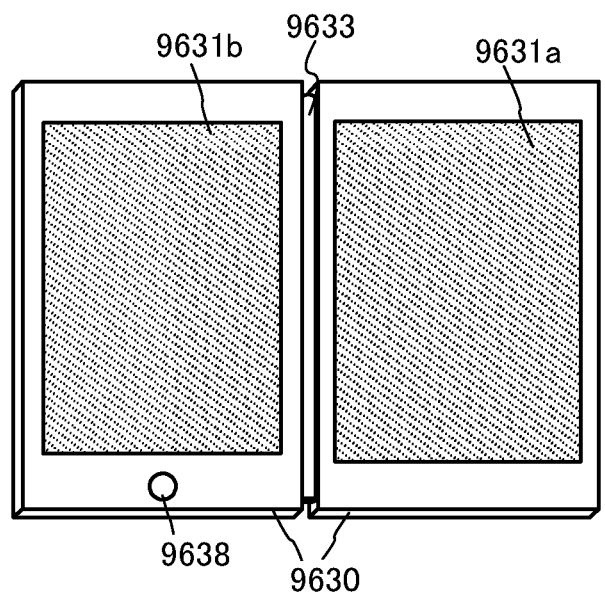

FIG. 12C illustrates a double-foldable portable information terminal. The double-foldable portable information terminal illustrated in FIG. 12C includes a housing 9630, a display portion 9631a, a display portion 9631b, a hinge 9633, and an operation switch 9638. The semiconductor device of one embodiment of the present invention can be applied to an arithmetic unit, a wireless circuit, or a memory circuit inside a main body.

By using the semiconductor device of one embodiment of the present invention, the performance of an electronic device can be improved, the power consumption thereof can be reduced, and the reliability thereof can be improved.

This embodiment can be implemented in combination with the other embodiments as appropriate.

This application is based on Japanese Patent Application serial No. 2011-282483 filed with Japan Patent Office on Dec. 23, 2011, the entire contents of which are hereby incorporated by reference.

What is claimed is:

1. A semiconductor device comprising:
   a first transistor over a substrate, comprising:
      a first oxide semiconductor layer over the substrate;
      a first insulating film over the first oxide semiconductor layer; and
      a first gate electrode over the first insulating film,
   a second transistor overlapping with the first transistor, comprising:
      the first gate electrode;
      a second insulating film over the first gate electrode; and
      a second oxide semiconductor layer over the second insulating film,
   a first capacitor over the substrate, comprising:
      a first conductive layer over the substrate;
      the first insulating film over the first conductive layer; and
      a second conductive layer over the first insulating film, and
   a second capacitor overlapping with the first capacitor, comprising:
      the second conductive layer;
      the second insulating film over the second conductive layer; and
      a third conductive layer over the second oxide semiconductor layer.

2. The semiconductor device according to claim 1,
   wherein the first transistor and the first capacitor are included in a first memory cell, and
   wherein the second transistor and the second capacitor are included in a second memory cell.

3. The semiconductor device according to claim 1,
   wherein the first oxide semiconductor layer and the second oxide semiconductor layer have a crystal portion.

4. The semiconductor device according to claim 1,
   wherein the first gate electrode of each of the first transistor and the second transistor serves as a first word line.

5. The semiconductor device according to claim 1,
   wherein the second conductive layer of each of the first capacitor and the second capacitor serves as a first capacitor line.

6. A semiconductor device comprising:
   a first transistor over a substrate, comprising:
      a first oxide semiconductor layer over the substrate;
      a first insulating film over the first oxide semiconductor layer; and
      a first gate electrode over the first insulating film,
   a second transistor overlapping with the first transistor, comprising:
      the first gate electrode;
      a second insulating film over the first gate electrode; and
      a second oxide semiconductor layer over the second insulating film,
   a first capacitor over the substrate, comprising:
      a first conductive layer over the substrate;
      the first insulating film over the first conductive layer; and
      a second conductive layer over the first insulating film, and
   a second capacitor overlapping with the first capacitor, comprising:
      the second conductive layer;
      the second insulating film over the second conductive layer; and
      a third conductive layer over the second oxide semiconductor layer, wherein the first conductive layer is in contact with the first oxide semiconductor layer and serves as one of a source and a drain of the first transistor, and
wherein the third conductive layer is in contact with the second oxide semiconductor layer and serves as one of a source and a drain of the second transistor.

7. The semiconductor device according to claim 6,
wherein the first transistor and the first capacitor are included in a first memory cell, and
wherein the second transistor and the second capacitor are included in a second memory cell.

8. The semiconductor device according to claim 6,
wherein the first oxide semiconductor layer and the second oxide semiconductor layer have a crystal portion.

9. The semiconductor device according to claim 6,
wherein the first gate electrode of each of the first transistor and the second transistor serves as a first word line.

10. The semiconductor device according to claim 6,
wherein the second conductive layer of each of the first capacitor and the second capacitor serves as a first capacitor line.

11. A semiconductor device comprising:
a first transistor over a substrate, comprising:
    a first oxide semiconductor layer over the substrate;
    a first insulating film over the first oxide semiconductor layer; and
    a first gate electrode over the first insulating film,
a second transistor overlapping with the first transistor, comprising:
    the first gate electrode;
    a second insulating film over the first gate electrode; and
    a second oxide semiconductor layer over the second insulating film,
a third transistor over the substrate, comprising:
    a third oxide semiconductor layer over the substrate;
    the first insulating film over the third oxide semiconductor layer; and
    a second gate electrode over the first insulating film, and
a fourth transistor overlapping with the third transistor, comprising:
    the second gate electrode;
    the second insulating film over the second gate electrode; and
    a fourth oxide semiconductor layer over the second insulating film.

12. The semiconductor device according to claim 11,
wherein the first transistor is included in a first memory cell,
wherein the second transistor is included in a second memory cell,
wherein the third transistor is included in a third memory cell, and
wherein the fourth transistor is included in a fourth memory cell.

13. The semiconductor device according to claim 11,
wherein the first oxide semiconductor layer and the second oxide semiconductor layer have a crystal portion.

14. The semiconductor device according to claim 11,
wherein the first gate electrode of each of the first transistor and the second transistor serves as a first word line, and
wherein the second gate electrode of each of the third transistor and the fourth transistor serves as a second word line.

15. The semiconductor device according to claim 11, further comprising:
a first capacitor over the substrate, comprising:
    a first conductive layer over the substrate;
    the first insulating film over the first conductive layer; and
    a second conductive layer over the first insulating film, and
a second capacitor overlapping with the first capacitor, comprising:
    the second conductive layer;
    the second insulating film over the second conductive layer; and
    a third conductive layer over the second oxide semiconductor layer,
a third capacitor over the substrate, comprising:
    a fourth conductive layer over the substrate;
    the first insulating film over the fourth conductive layer; and
    a fifth conductive layer over the first insulating film, and
a fourth capacitor overlapping the third capacitor, comprising:
    the fifth conductive layer;
    the second insulating film over the fifth conductive layer; and
    a sixth conductive layer over the first insulating film.

16. The semiconductor device according to claim 11, further comprising:
a first capacitor over the substrate, comprising:
    a first conductive layer over the substrate;
    the first insulating film over the first conductive layer; and
    a second conductive layer over the first insulating film, and
a second capacitor overlapping with the first capacitor, comprising:
    the second conductive layer;
    the second insulating film over the second conductive layer; and
    a third conductive layer over the second oxide semiconductor layer,
a third capacitor over the substrate, comprising:
    a fourth conductive layer over the substrate;
    the first insulating film over the fourth conductive layer; and
    a fifth conductive layer over the first insulating film, and
a fourth capacitor overlapping the third capacitor, comprising:
    the fifth conductive layer;
    the second insulating film over the fifth conductive layer; and
    a sixth conductive layer over the first insulating film,
wherein the second conductive layer of each of the first capacitor and the second capacitor serves as a first capacitor line, and
wherein the fifth conductive layer of each of the third capacitor and the fourth capacitor serves as a second capacitor line.

17. The semiconductor device according to claim 11, further comprising a first conductive layer and a second conductive layer,
wherein the first conductive layer is in contact with the first oxide semiconductor layer and the third oxide semiconductor layer, and
wherein the second conductive layer is in contact with the second oxide semiconductor layer and the fourth oxide semiconductor layer.

18. The semiconductor device according to claim 11, further comprising a first conductive layer and a second conductive layer,
   wherein the first conductive layer serves as one of a source and a drain of each of the first transistor and the third transistor, and
   wherein the second conductive layer serves as one of a source and a drain of each of the second transistor and the fourth transistor.

19. The semiconductor device according to claim 11, further comprising a first conductive layer, a second conductive layer, a third conductive layer, and a fourth conductive layer,
   wherein the first conductive layer is in contact with the first oxide semiconductor layer and the third oxide semiconductor layer,
   wherein the second conductive layer is in contact with the second oxide semiconductor layer and the fourth oxide semiconductor layer,
   wherein the third conductive layer is in contact with the first conductive layer and provided between the substrate and the first and third transistors,
   wherein the fourth conductive layer is in contact with the second conductive layer and provided over the second and fourth transistors.

* * * * *